(12) United States Patent
Kitamura et al.

(10) Patent No.: US 7,821,060 B2
(45) Date of Patent: Oct. 26, 2010

(54) SEMICONDUCTOR DEVICE INCLUDING TRENCH GATE TRANSISTOR AND METHOD OF FORMING THE SAME

(75) Inventors: Yoshihiro Kitamura, Tokyo (JP); Toru Miyazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/219,197

(22) Filed: Jul. 17, 2008

(65) Prior Publication Data

US 2009/0020809 A1    Jan. 22, 2009

(30) Foreign Application Priority Data

Jul. 19, 2007    (JP) .................... P2007-188084

(51) Int. Cl.
*H01L 29/76* (2006.01)
(52) U.S. Cl. .................. 257/330; 257/E29.262
(58) Field of Classification Search ........... 257/330, 257/413, E29.262; 438/270, 589, 592
See application file for complete search history.

(56) References Cited

U.S. PATENT DOCUMENTS

| | | | |
|---|---|---|---|
| 7,045,858 B2 | 5/2006 | Matsuda et al. | |
| 7,432,155 B2 * | 10/2008 | Park | 438/259 |
| 7,566,645 B2 * | 7/2009 | Lee | 438/589 |
| 2006/0091453 A1 | 5/2006 | Matsuda et al. | |
| 2006/0289931 A1 * | 12/2006 | Kim et al. | 257/330 |

FOREIGN PATENT DOCUMENTS

| | | |
|---|---|---|
| JP | 9-172064 | 6/1997 |
| JP | 2003-7676 | 1/2003 |
| JP | 2005-243932 | 9/2005 |
| JP | 2006-66611 | 3/2006 |

* cited by examiner

*Primary Examiner*—Mark Prenty
(74) *Attorney, Agent, or Firm*—McGinn Intellectual Property Law Group, PLLC

(57) ABSTRACT

A semiconductor device includes an active region having a groove, a gate insulating film, and a gate electrode. The gate electrode may include first and second layers. The first layer extends along the gate insulating film. The first layer is electrically conductive. The second layer extends along the first layer. The second layer is separate from the gate insulating film by the first layer.

7 Claims, 19 Drawing Sheets

SEMICONDUCTOR DEVICE INCLUDING TRENCH GATE TRANSISTOR AND METHOD OF FORMING THE SAME

BACKGROUND OF THE INVENTION

1. Field of the Invention

The present invention generally relates to a semiconductor device and a method of forming the same. More specifically, the present invention relates to a semiconductor device including a trench gate transistor and a method of forming the same.

Priority is claimed on Japanese Patent Application No. 2007-188084, filed Jul. 19, 2007, the content of which is incorporated herein by reference.

2. Description of the Related Art

In recent years, there has been progressed shrinkage of memory cells in a semiconductor device such as a dynamic random access memory which will hereinafter be referred to as DRAM, due to development of microprocessing techniques. In general, shrinkage of a memory cell may reduce the dimensions of a transistor that constitute the memory cell. Reduction in the dimensions of a transistor may cause remarkable short channel effects of the transistor. In DRAM, shrinkage of a memory cell may reduce the channel length of a transistor that is included in the memory cell. This deteriorates the performances of the transistor, thereby deteriorating data retention and writing performances of the memory cell. For example, Japanese Unexamined Patent Application, First Publications, Nos. 9-172064, 2003-7676, 2005-243932, and 2006-66611 each address trench gate transistors with a three-dimensional channel structure. A part of a gate electrode is buried with a gate insulator in a trench groove that is formed in a semiconductor substrate.

SUMMARY

In one embodiment, a semiconductor device may include, but is not limited to, an active region having a groove, a gate insulating film extending along the inside wall of the groove, and a gate electrode in the groove. The gate electrode may include, but is not limited to, first and second layers. The first layer extends along the gate insulating film, the first layer being electrically conductive. The second layer extends along the first layer. The second layer is separate from the gate insulating film by the first layer. The second layer is different in thermal property from the first layer.

In another embodiment, a semiconductor device may include, but is not limited to, an active region having a groove, a gate insulating film extending along the inside wall of the groove, and a gate electrode in the groove. The gate electrode may include, but is not limited to, first and second layers. The first layer extends along the gate insulating film, the first layer being electrically conductive. The first layer is free of any void adjacent to the gate insulating film. The second layer extends along the first layer. The second layer is separate from the gate insulating film by the first layer.

In still another embodiment, a semiconductor device may include, but is not limited to, an active region having a groove, a gate insulating film extending along the inside wall of the groove, and a gate electrode in the groove. The groove has an expanded portion that is wider than the opening of the groove. The gate electrode has a multi-layered structure in at least the expanded portion of the groove. The multi-layered structure may include, but is not limited to, first and second layers. The first layer extends along the gate insulating film. The first layer is electrically conductive. The second layer extends along the first layer. The second layer is separate from the gate insulating film by the first layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, some embodiments of the related art will be described in detail with reference to FIGS. 29, 30, 31A and 31B, in order to facilitate the understanding of the present invention.

Figure 29:
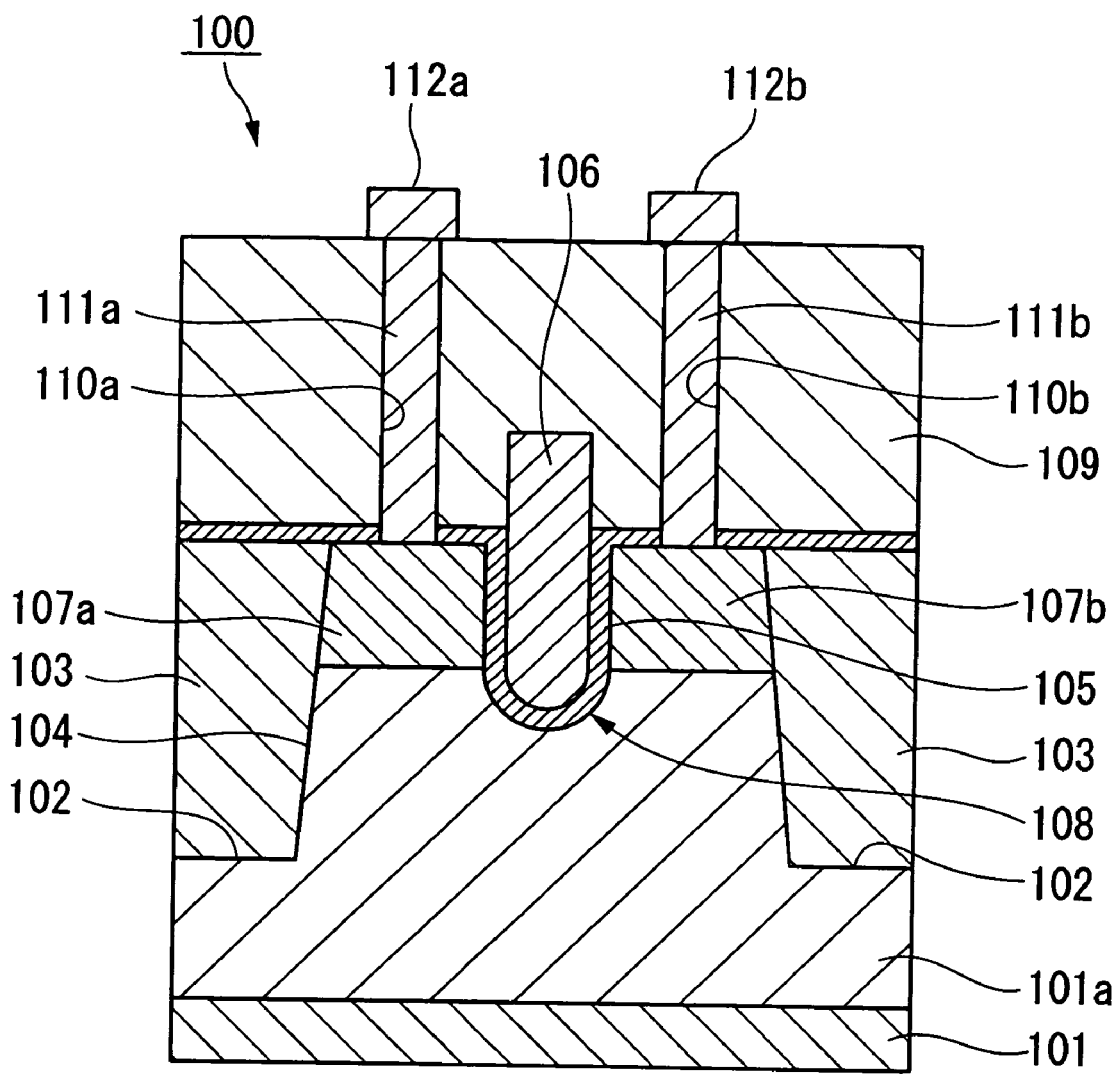
FIG. 29 is a fragmentary cross sectional elevation view illustrating a semiconductor device including a trench gate transistor in accordance with the related art.

With reference to FIG. 29, a semiconductor device includes a trench gate transistor 100. The trench gate transistor 100 may include the following elements. A semiconductor substrate 101 has a surface layer 101a. The surface layer 101a may be made of silicon. Grooves 102 are formed in the surface layer 101a Device isolation regions 103 are disposed in the grooves 102. The device isolation regions 103 may be formed by silicon oxide films that are buried in the grooves 102. An active region 104 is defined by the device isolation regions 103. The active region 104 is isolated by the device isolation regions 103 from other active regions that are not illustrated. A trench groove 108 is formed in the active region 104. Source and drain regions 107a and 107b are formed in upper regions of the active region 104 of the surface layer 101a. The source and drain regions 107a and 107b are separated from each other by the trench groove 108. The trench groove 108 may be deeper than the source and drain regions 107a and 107b. A gate insulating film 105 is formed on the bottom and side walls of the trench groove 108 and on the source and drain regions 107a and 107b, and the device isolation regions 103. The transistor 100 has a trench gate structure. A gate electrode 106 is formed on the gate insulating film 105. The gate electrode 106 is partially buried in the trench groove 108. The gate electrode 106 partially projects upwardly from the trench groove 108. The source and drain regions 107a and 107b can be formed by an ion-implantation of impurity ions into the active region 104 except in the trench groove 108 that is covered by the gate electrode 106.

An inter-layer insulator 109 may be disposed over the gate insulating film 105. Contact holes 110a and 110b penetrate the inter-layer insulator 109 and the gate insulating film 105. The contact holes 110a and 110b are positioned over the source and drain regions 107a and 107b, respectively. Contact plugs 111a and 111b are disposed in the contact holes 110a and 110b, respectively, so that the contact plugs 111a and 111b are electrically connected to the source and drain regions 107a and 107b, respectively. Contact pads 112a and 112b are disposed on the contact plugs 111a and 111b, respectively.

The trench gate transistor 100 has the trench gate structure which allows that the effective channel length is adjusted by adjusting the depth of the trench groove 108. The trench gate structure can prevent that the threshold voltage Vth is dropped due to shrinkage of the semiconductor device.

Further shrinkage of the semiconductor device having the trench gate transistor 100 may make it difficult to obtain a desired threshold voltage Vth of the trench gate transistor 100. The trench gate transistor 100 may be modified.

Figure 30:
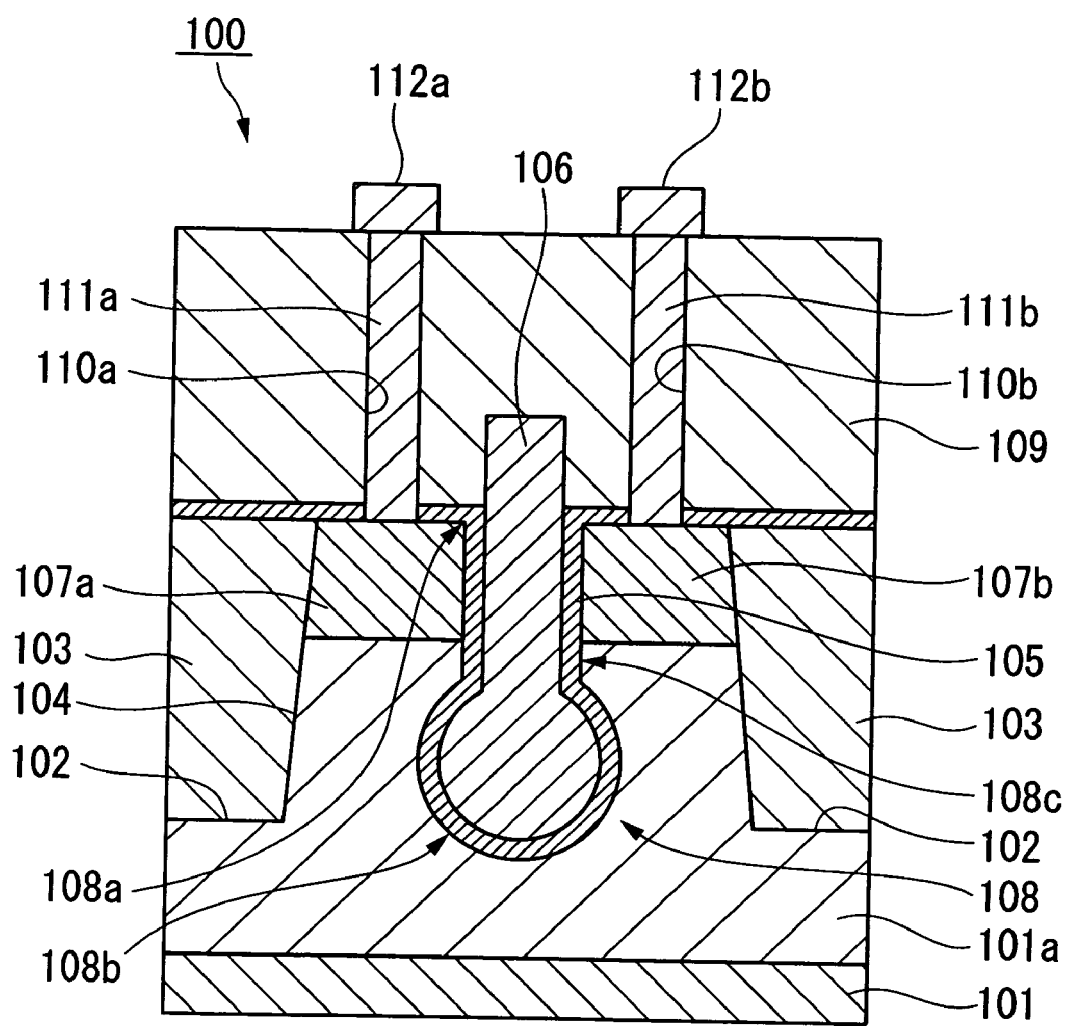
FIG. 30 is a fragmentary cross sectional elevation view illustrating a semiconductor device including a trench gate transistor in accordance with the related art.

With reference to FIG. 30, the trench gate transistor 100 may be modified for countermeasure to further shrinkage of the semiconductor device. The modified trench gate transistor 100 has a trench groove 108 which has an opening 108a, a lower portion 108b and an upper portion 108c. The lower portion 108b is wider than the opening 108a and the upper portion 108c. The lower portion 108b may be recognized as a wider portion or an expanded portion. The lower portion 108b is positioned in the surface layer 101a. The lower portion 108b is positioned below the source and drain regions 107a and 107b. Enlargement in horizontal dimension of the lower portion 108b increases the channel length of the trench gate transistor 100 without increasing the dimension of the opening 108a of the trench groove 108. The gate electrode 106 also has upper and lower portions. The lower portion of the gate electrode 106 is positioned in the lower portion 108b of the trench groove 108.

Figure 31A:
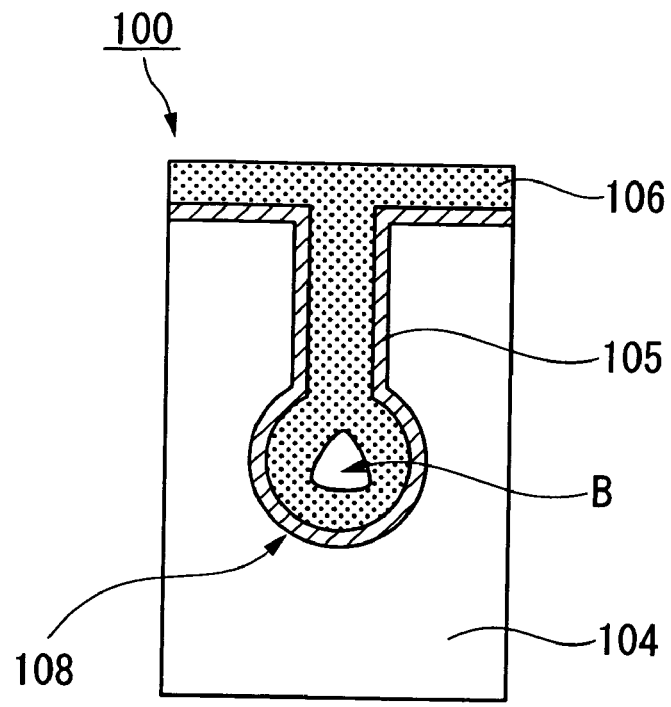
FIG. 31A is a fragmentary enlarged cross sectional elevation view illustrating a trench gate transistor in the semiconductor device of FIG. 30.

The gate electrode 106 may be made of impurity-doped amorphous silicon or polycrystalline silicon. In this case, the amorphous silicon or polycrystalline silicon gate electrode 106 may be formed in the trench groove 108 by a chemical vapor deposition. Since the opening 108a and the upper portion 108c are narrower than the lower portion 108b, the lower portion 108b of the trench groove 108 are likely to be filled imperfectly with amorphous silicon or polycrystalline silicon, thereby forming a void B as shown in FIG. 31A. The void B is formed in the lower portion of the gate electrode 106 or in the lower portion 108b of the trench groove 108.

Figure 31B:
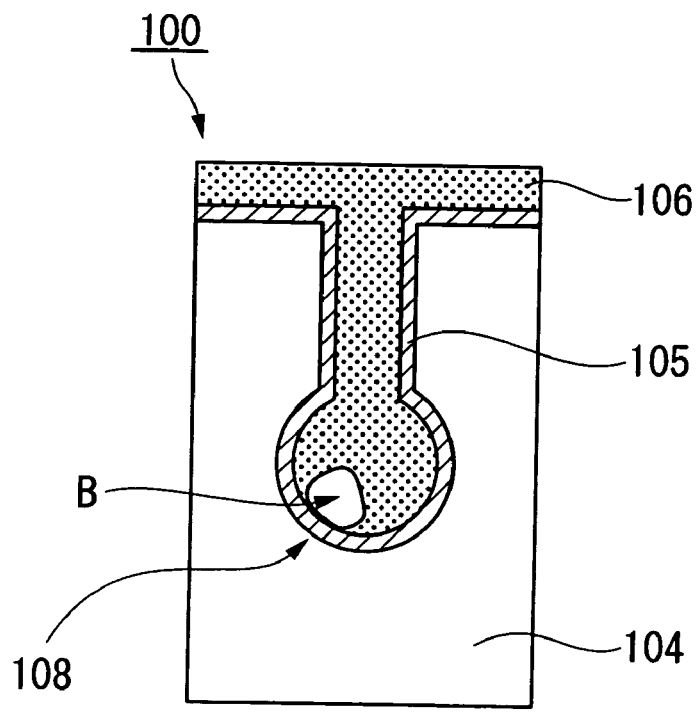
FIG. 31B is a fragmentary enlarged cross sectional elevation view illustrating a trench gate transistor in the semiconductor device of FIG. 30.

As shown in FIG. 31B, the void B may be moved due to silicon migration of the gate electrode 106 in the lower portion 108b of the trench groove 108. Silicon migration of the gate electrode 106 may be caused in a post-heat treatment process. In the lower portion of the gate electrode 106, the void B may be moved to a position adjacent to the gate insulating film 105 so that the void B may contact with the gate insulating film 105 as shown in FIG. 31B. The void B contacting with the gate insulating film 105 prevents that the gate electrode 106 contacts with the gate insulating film 105 at the contact position where the void B contacts with the gate insulating film 105. In some cases, the gate electrode 106 may be separated from the gate insulating film 105 by the void B that contacts with the gate insulating film 105. In this case, it is generally difficult to obtain the desired or intended performances of the trench gate transistor 100. Impurity-doped amorphous silicon may often be used for the gate electrode material. In a post-heat treatment process, the impurity-doped amorphous silicon is crystallized, while migration of the impurity-doped amorphous silicon is likely to be caused, thereby likely changing the position and shape of the void B. Once the void is formed in the lower expanded portion of a trench groove, it is generally difficult to control the position and shape of a void in the final product, thereby causing variations in performances of the trench gate transistor. Impurity-doped amorphous silicon has often been used to fill up the trench groove 108. In this case, if the void B is once formed, the void B is likely to be moved in crystallization of silicon in a post-heat treatment.

It is desired to control the position or shape of a void in the final product or final process, in order to control variation of the performances of a transistor. It is also desired to prevent that in the trench gate, any void is positioned adjacent to the interface between the gate electrode and the gate insulating film in the trench groove, thereby preventing variations in performances of the trench gate transistor.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

Figure 1:
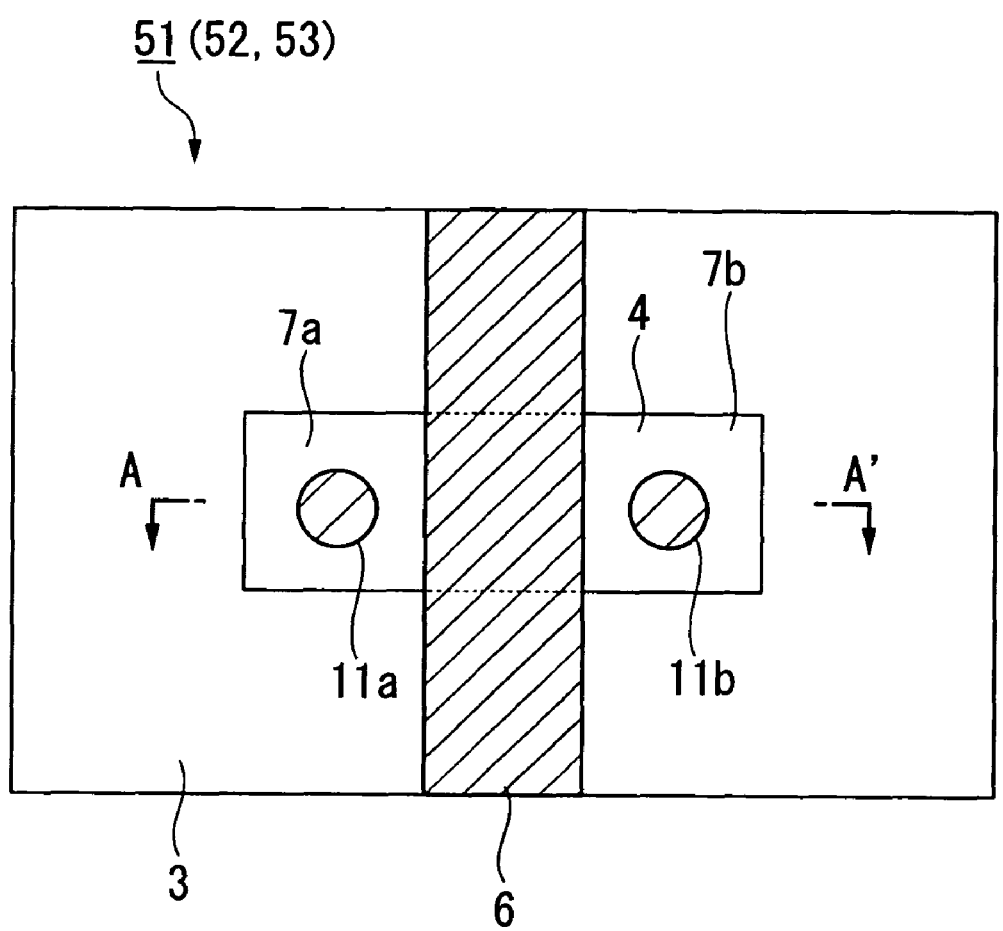
FIG. 1 is a fragmentary plan view illustrating a semiconductor device in accordance with a first preferred embodiment of the present invention.
Figure 2:
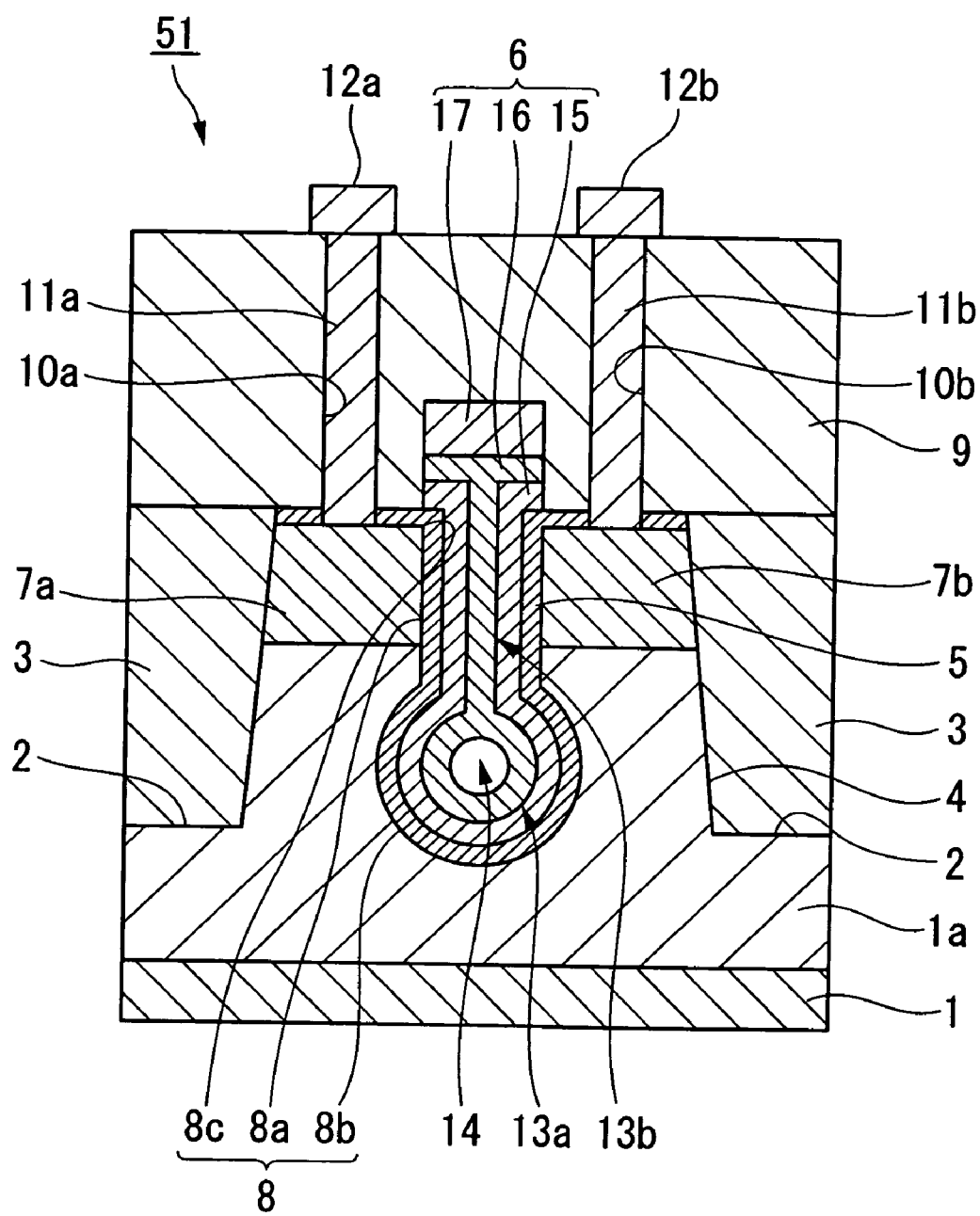
FIG. 2 is a fragmentary cross sectional elevation view illustrating the semiconductor device, taken along an A-A' line of FIG. 1.

A trench gate transistor 51 will be described in accordance with a first preferred embodiment of the present invention. FIG. 1 is a fragmentary plan view illustrating a semiconductor device in accordance with a first preferred embodiment of the present invention. FIG. 2 is a fragmentary cross sectional elevation view illustrating the semiconductor device, taken along an A-A' line of FIG. 1.

With reference to FIGS. 1 and 2, a trench gate transistor 51 may include, but is not limited to, the following elements. A semiconductor substrate 1 may include a surface layer 1a. The surface layer 1a may typically be made of; but not limited to, silicon. The surface layer 1a may have isolation grooves 2. Device isolation regions 3 may be disposed in the isolation grooves 2. The device isolation regions 3 may be formed by silicon oxide films that bury the isolation grooves 2. An active region 4 may in general be defined by the device isolation regions 3. The active region 4 may be isolated by the device isolation regions 3 from other active regions that are not illustrated.

The trench gate transistor 51 may have a trench gate structure. The trench gate structure may include, but is not limited to, a trench groove 8, a gate insulating film 5, and a gate electrode 6. The trench groove 8 is formed in the active region 4. Source and drain regions 7a and 7b are formed in upper regions of the active region 4 of the surface layer 1a. The source and drain regions 7a and 7b are separated from each other by the trench groove 8. The source and drain regions 7a and 7b can be formed by an ion-implantation of impurity ions into the active region 4 except in the trench groove 8. The trench groove 8 may be deeper than the source and drain regions 7a and 7b. The gate insulating film 5 is formed on the inside walls of the trench groove 8 and on the source and drain regions 7a and 7b, and the device isolation regions 3. The gate electrode 6 is partially presented in the trench groove 8.

The trench groove 8 may have a first groove portion 8a, a second groove portion 8b which is positioned under the first groove portion 8a, and an opening 8c. The second groove portion 8b is continued to the first groove portion 8a. The first and second groove portions 8a and 8b communicate with each other. In some case, the first groove portion 8a may have, but not limited to, a generally rectangular shape in vertical cross section. In some case, the first groove portion 8a may have, but is not limited to, a uniform width which is equal to the width of the opening 8c. In some case, the second groove portion 8b may have, but is not limited to, a generally circular shape in vertical cross section. The second groove portion 8b may typically be wider than the first groove portion 8a. The second groove portion 8b may be recognized as a wider groove portion or an expanded groove portion. The second groove portion 8b may typically be positioned in the surface layer 1a. The second groove portion 8b may typically be positioned below the source and drain regions 7a and 7b.

Enlargement in the horizontal dimension of the second groove portion 8b increases the channel length of the trench gate transistor 51 without increasing the horizontal dimension of the opening 8c. The trench gate transistor 51 has the trench gate structure which allows that the effective channel length is adjustable by adjusting the depth of the trench groove 8. The trench gate structure can prevent that the threshold voltage Vth is dropped due to shrinkage of the semiconductor device.

In some cases, a part of the gate electrode 6 may bury the trench groove 8. The gate electrode 6 may partially project upwardly from the trench groove 8. The source and drain regions 7a and 7b may typically be formed by an ion-implantation of impurity ions into the active region 4 except in the trench groove 8.

An inter-layer insulator 9 may be disposed over the gate insulating film 105 and the device isolation regions 3. Contact holes 10a and 10b may penetrate the inter-layer insulator 9 and the gate insulating film 5. The contact holes 10a and 10b may be positioned over the source and drain regions 7a and 7b, respectively. Contact plugs 11a and 11b may be disposed in the contact holes 10a and 10b, respectively, so that the contact plugs 11a and 11b are electrically connected to the source and drain regions 7a and 7b, respectively. Contact pads 12a and 12b may be disposed on the contact plugs 11a and 11b, respectively.

The trench gate transistor 51 has the trench gate structure. The trench gate structure has the gate electrode 6 that may bury the trench groove 8. The gate electrode 6 has a multi-layered structure. In some cases, the multi-layered structure of the gate electrode 6 may include at least first and second conductive layers 15 and 16. Typically, the multi-layered structure of the gate electrode 6 may include, but is not limited to, first, second and third conductive layers 15, 16 and 17.

In the trench groove, the gate insulating film 5 may extend along the inside wall of the trench groove. Typically, the first conductive layer 15 may extend along the gate insulating film 5 in the trench groove 8. Typically, the first conductive layer 15 contacts with the gate insulating film 5 in the trench groove 8, while no voids are present adjacent to the interface between the first conductive layer 15 and the gate insulating film 5. The interface between the first conductive layer 15 and the gate insulating film 5 may provide the effective channel length. Typically, the second conductive layer 16 may extend along the first conductive layer 15. Typically, the second conductive layer 16 may contact with the first conductive layer 15. In some cases, the second conductive layer 16 may be present in and over the trench groove 8. In some cases, the second conductive layer 16 may have a top portion which extends over the top portion of the first conductive layer 15. In some cases, the third conductive layer 17 may be disposed over the top portion of the second conductive layer 16. The third conductive layer 17 may be separated from the first conductive layer 15 by the second conductive layer 16.

In some cases, the second conductive layer 16 may include first and second portions 13a and 13b. The first portion 13a is present in the second groove portion 8b. The second portion 13b is present in the first groove portion 8a. The first portion 13a may have a void 14. In other words, the first portion 13a may surround the void 14 omnidirectionally. The first portion 13a may separate the void 14 from the first conductive layer 15. The first conductive layer 15 in combination with the first portion 13a of the second conductive layer 16 may separate the void 14 from the interface between the gate electrode 6 and the gate insulating film 5. Typically, the second portion 13b may extend in a depth direction of the trench groove 8. The first portion 13a contacts with the first conductive layer 15 in the second groove portion 8b. The first portion 13a is separated from the gate insulating film 5 by the first conductive layer 15. The second portion 13b contacts with the first conductive layer 15 in the first groove portion 8a. The second portion 13b is separated from the gate insulating film 5 by the first conductive layer 15.

The first conductive layer 15 may be made of a first conductive material. The second conductive layer 16 may be made of a second conductive material that is thermally more stable than the first conductive material of the first conductive layer 15. Namely, the second conductive layer 16 may be thermally more stable than the first conductive layer 15. Typically, the first conductive layer 15 may be made of a silicon-based material such as an impurity-doped polysilicon. In this case, the second conductive layer 16 may be made of a refractory metal silicide such as tungsten silicide. The third conductive layer 17 may be made of a refractory metal such as tungsten.

The gate electrode 6 may include, but not limited to, the first conductive layer 15 as a first layer and the second conductive layer 16 as a second layer. The first conductive layer 15 as the first layer is electrically conductive to perform as the gate electrode 6. The second conductive layer 16 as the second layer is separate from the gate insulating film 5 by the first conductive layer 15 as the first layer. The second conductive layer 16 as the second layer is different in thermal property from the first conductive layer 15 as the first layer. The second conductive layer 16 as the second layer is thermally more stable than the first conductive layer 15 as the first layer. The first conductive layer 15 as the first layer is free of any void adjacent to the gate insulating film 5.

In any post-heat treatment, no migration or reduced migration of the second conductive material is caused in the second conductive layer 16 independent from whether any migration is caused in the first conductive layer 15. Such no migration or reduced migration may cause no move or reduced move of the void 14 in the trench groove 8 so that the void 14 is not moved to any position adjacent to the gate insulating film 5 in the second groove portion 8b. The first portion 13a shows no migration or deformation in the heat treatment process, and the first portion 13a holds surrounding the void 14 omnidirectionally. The above-described multi-layered structure of the gate electrode 6 can prevent that any void is moved to the interface between the gate electrode 6 and the gate insulating film 5. In the final product or the final process, typically no void is present on or adjacent to the interface between the gate electrode 6 and the gate insulating film 5. This causes no variation or reduced variation in performance of the semiconductor device.

The multi-layered structure of the trench gate electrode 6 can suppress variation in performance of the semiconductor device including the trench gate transistor 51. The trench gate transistor 51 can obtain a desired threshold voltage Vth by increasing or adjusting the effective channel length under the conditions for further shrinkage of the semiconductor device.

A typical example of a method of forming the trench gate transistor 51 that is shown in FIGS. 1 and 2 will be described with reference to FIGS. 3-14.

Figure 3:
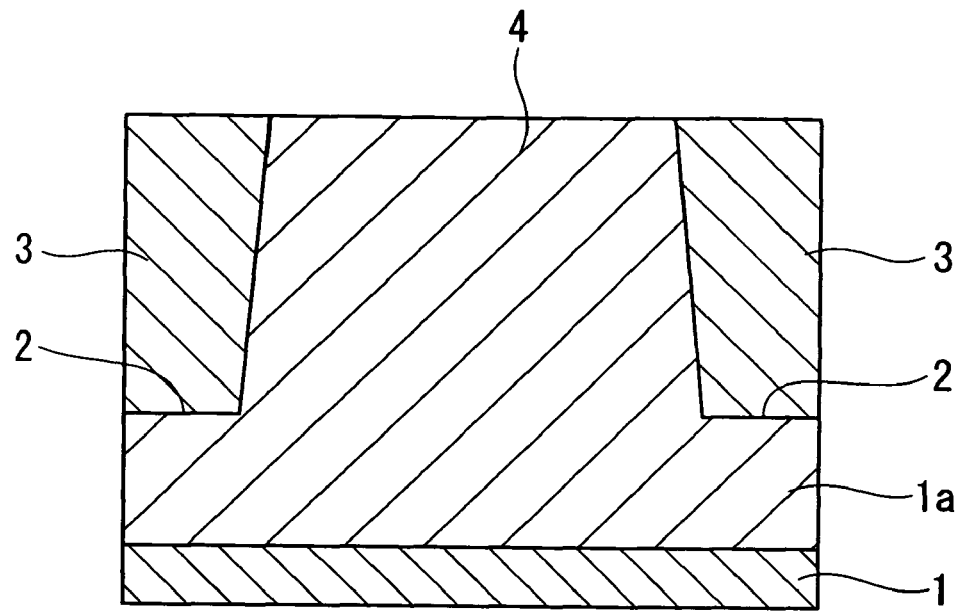
FIG. 3 is a fragmentary cross sectional elevation view illustrating a step involved in a method of forming the semiconductor device of FIGS. 1 and 2 in accordance with the first preferred embodiment of the present invention.

With reference to FIG. 3, a semiconductor substrate 1 including a surface layer 1a is prepared. Isolation grooves 2 are formed in the surface layer 1a of the semiconductor substrate 1. Silicon oxide films bury the isolation grooves 2, thereby forming device isolation regions 3 in the isolation grooves 2. The device isolation regions 3 may be called to as shallow trench isolations (STI). An active region 4 is thus defined by the device isolation regions 3. An ion-implantation of an impurity is carried out to for the purpose of forming a well and a channel. A heat treatment is carried out to activate the impurity.

The semiconductor substrate 1 has the surface layer 1a which includes silicon. The semiconductor substrate 1 may be implemented by, but not limited to, a silicon substrate, and a silicon on insulator (SOI) substrate. The SOI substrate includes a silicon thin film over a buried oxide film. The SOI substrate may reduce parasitic capacitance. In some cases, the SOI substrate may be suitable for high performance device.

Figure 4:
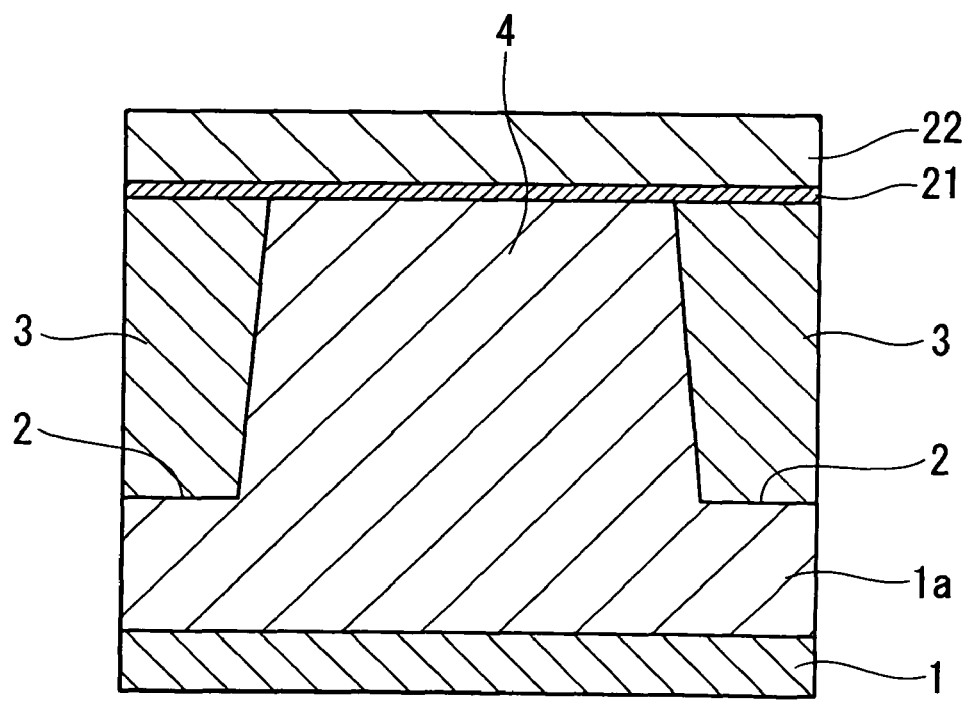
FIG. 4 is a fragmentary cross sectional elevation view illustrating a step, subsequent to the step of FIG. 3, involved in the method of forming the semiconductor device of FIGS. 1 and 2 in accordance with the first preferred embodiment of the present invention.

With reference to FIG. 4, a silicon oxide film 21 is formed which covers the device isolation regions 3 and the active region 4. A silicon nitride film 22 is formed which covers the silicon oxide film 21.

Figure 5:
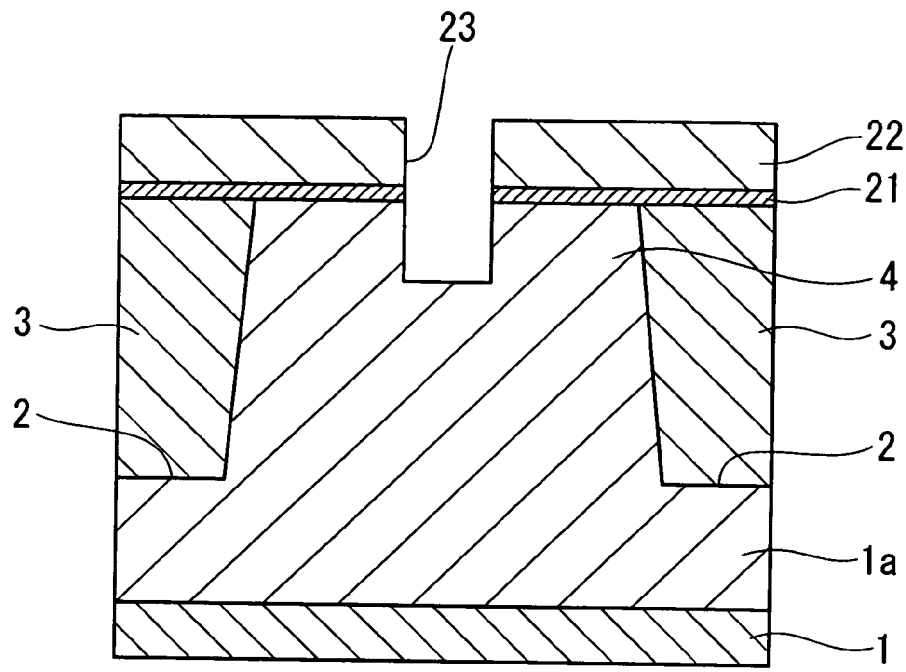
FIG. 5 is a fragmentary cross sectional elevation view illustrating a step, subsequent to the step of FIG. 4, involved in the method of forming the semiconductor device of FIGS. 1 and 2 in accordance with the first preferred embodiment of the present invention.

With reference to FIG. 5, a resist pattern is formed over the silicon nitride film 22 by using a lithography technique. The resist pattern is not illustrated. The resist pattern has an opening which extends across the active region 4. An anisotropic etching process is carried out using the resist pattern as a mask for patterning the silicon nitride film 22. The anisotropic etching process may be implemented by a dry etching process. The resist pattern is removed. A further anisotropic etching process is carried out using the patterned silicon nitride film 22 as a mask to selectively remove the silicon oxide film 21 and the surface layer 1a, thereby pattering the active region 4. As a result, a first groove 23 is formed in the active region 4, wherein the first groove 23 penetrates the silicon oxide film 21 and the silicon nitride film 22 and reaches the active region 4.

Figure 6:
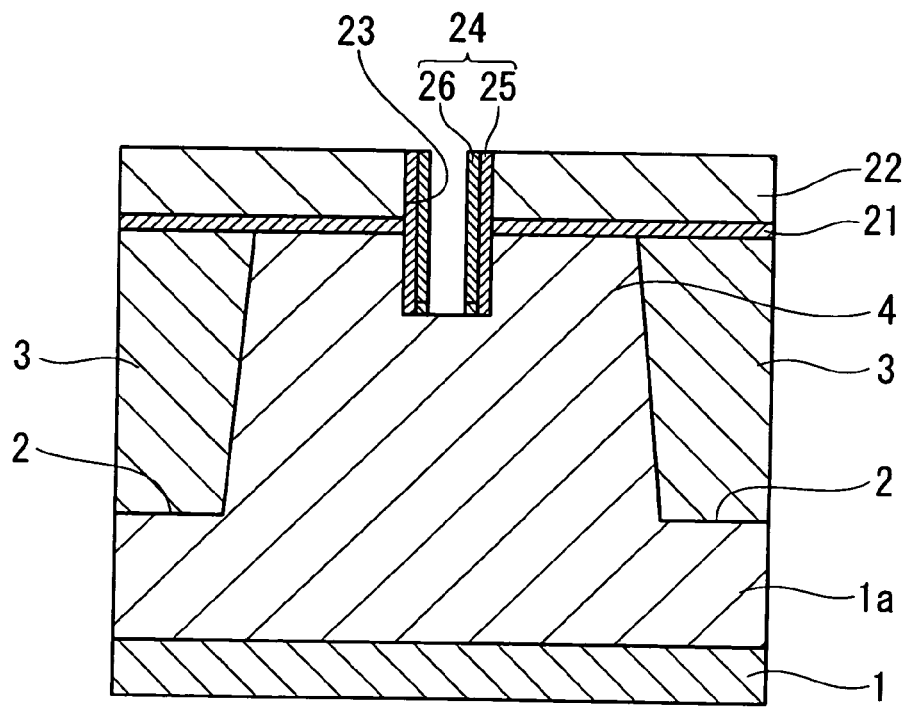
FIG. 6 is a fragmentary cross sectional elevation view illustrating a step, subsequent to the step of FIG. 5, involved in the method of forming the semiconductor device of FIGS. 1 and 2 in accordance with the first preferred embodiment of the present invention.

With reference to FIG. 6, side wall films 24 are formed which cover the side walls of the first groove 23. The side wall films 24 can be formed as follows. A silicon oxide film 25 is formed by a chemical vapor deposition on the bottom and side walls of the first groove 23 and on the upper surface of the silicon nitride film 22. A silicon nitride film 26 is formed on the silicon oxide film 25 by a chemical vapor deposition. The doubled layered structure of the silicon oxide film 25 and the silicon nitride film 26 does not fill up the first groove 23. An anisotropic etching process is carried out to selectively remove the doubled layered structure from the bottom of the first groove 23 and from the upper surface of the silicon nitride film 22, while the doubled layered structure resides the side walls of the first groove 23. As a result, the side wall films 24 having the doubled layered structure are formed. The anisotropic etching process can be implemented by a dry etching process.

Figure 7:
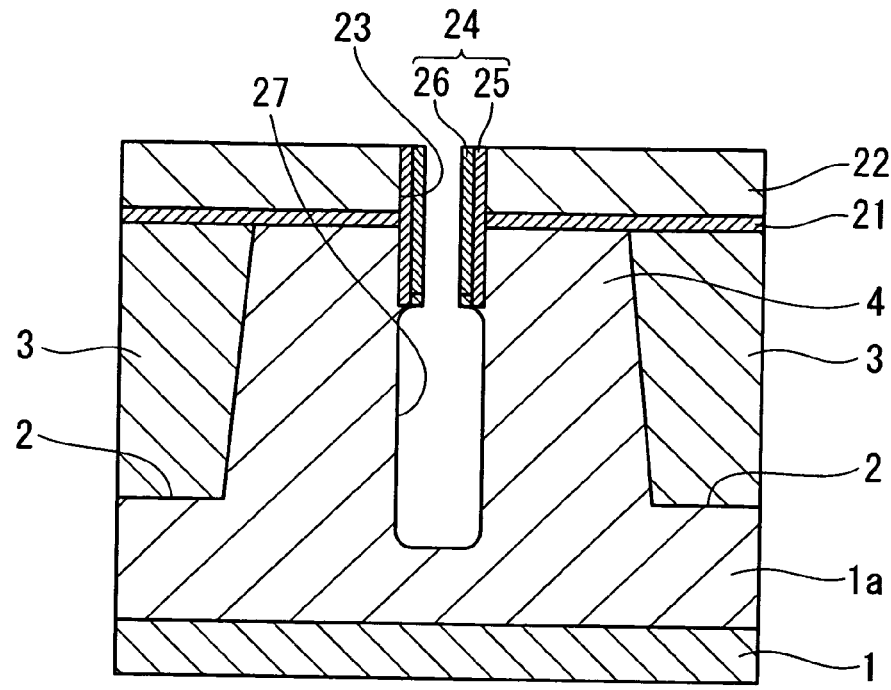
FIG. 7 is a fragmentary cross sectional elevation view illustrating a step, subsequent to the step of FIG. 6, involved in the method of forming the semiconductor device of FIGS. 1 and 2 in accordance with the first preferred embodiment of the present invention.

With reference to FIG. 7, an etching process is carried out to etch the bottom of the first groove 23, thereby forming a second groove 27. The second groove 27 is positioned directly under the first groove 23. The first and second grooves 23 and 27 are continued to each other. Preferably, the second groove 27 may be slightly wider than the first groove 23. The second groove 27 is formed in the surface layer 1a in the active region 4. The etching process may be implemented by mainly an anisotropic etching process but additionally an isotropic etching process, so as to form the second groove 27 wider than the first groove 23. The anisotropic etching process can be implemented by a dry etching process.

Figure 8:
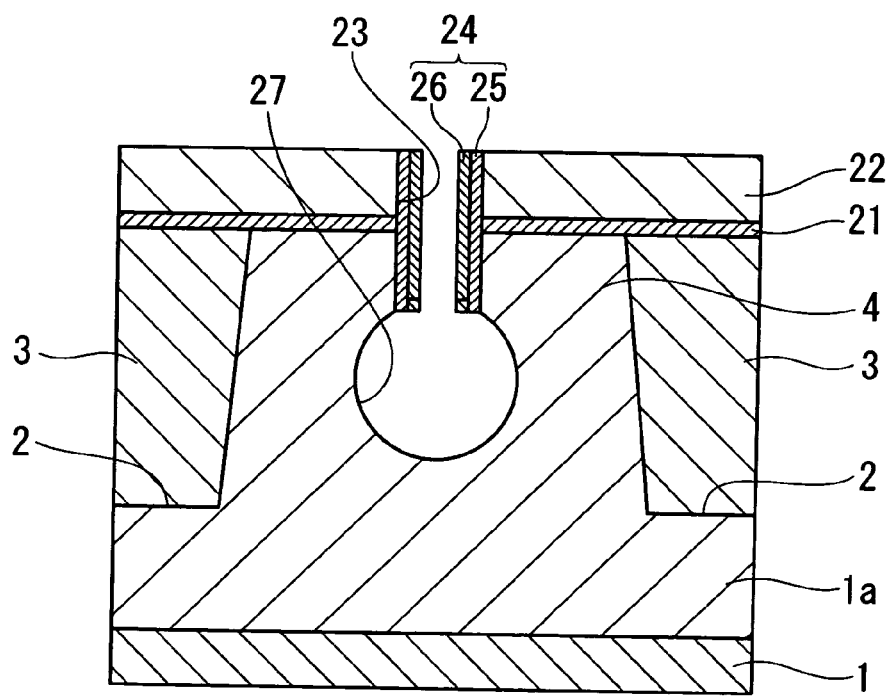
FIG. 8 is a fragmentary cross sectional elevation view illustrating a step, subsequent to the step of FIG. 7, involved in the method of forming the semiconductor device of FIGS. 1 and 2 in accordance with the first preferred embodiment of the present invention.

With reference to FIG. 8, a heat treatment is applied to the second groove 27, thereby causing migration of silicon in the active region 4. Migration of silicon is caused to reduce the surface energy toward the minimum. Migration of silicon deforms the sectioned shape of the second groove 27 toward a generally circle. The heat treatment may be implemented by a hydrogen anneal at about 850° C.

The second groove 27 can be formed by selectively exposing the bottom of the first groove 23 to an isotropic etching, so that the second groove 27 is wider than the first groove 23.

Figure 9:
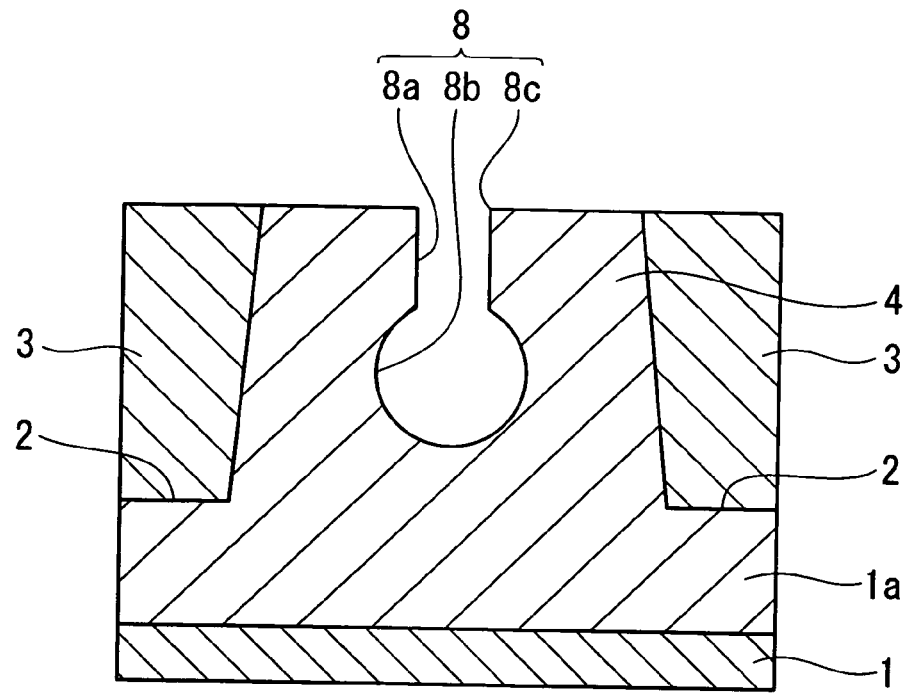
FIG. 9 is a fragmentary cross sectional elevation view illustrating a step, subsequent to the step of FIG. 8, involved in the method of forming the semiconductor device of FIGS. 1 and 2 in accordance with the first preferred embodiment of the present invention.

With reference to FIG. 9, the silicon nitride films 22 and 26 are removed using a hot phosphate solution. The silicon oxide films 21 and 25 are removed using a hydrofluoric acid solution. As a result, a trench groove 8 is formed in the active region 4. The trench groove 8 has a first groove portion 8a, a second groove portion 8b which is positioned under the first groove portion 8a, and an opening 8c. The second groove portion 8b is continued to the first groove portion 8a. The first and second groove portions 8a and 8b communicate with each other. The first groove portion 8a has a generally rectangular shape in vertical cross section. The first groove portion 8a has a uniform width which is equal to the width of the opening 8c. The second groove portion 8b has a generally circular shape in vertical cross section. The second groove portion 8b is wider than the first groove portion 8a. The second groove portion 8b is recognized as a wider groove portion or an expanded groove portion. The second groove portion 8b is positioned in the surface layer 1a. The second groove portion 8b is separate from the device isolation regions 3.

Figure 10:
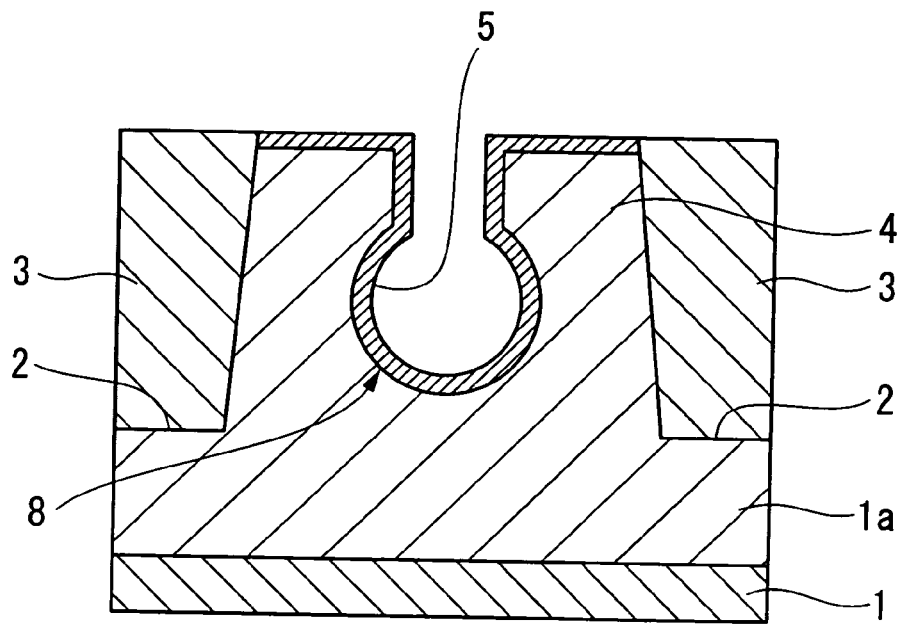
FIG. 10 is a fragmentary cross sectional elevation view illustrating a step, subsequent to the step of FIG. 9, involved in the method of forming the semiconductor device of FIGS. 1 and 2 in accordance with the first preferred embodiment of the present invention.

With reference to FIG. 10, a gate insulating film 5 is formed on the surface of the active region 4 and the inside walls of the trench groove 8. The gate insulating film 5 covers the inside walls of the first and second groove portions 8a and 8b. In some cases, the gate insulating film 5 may be made of silicon oxide. In this case, the gate insulating film 5 may be formed by a thermal oxidation of the inside walls of the trench groove 8. In other cases, the gate insulating film 5 may be implemented by a hot silicon oxide film (HTO) or a stack of a silicon oxide film and a silicon nitride film. The gate insulating film 5 may be formed by a chemical vapor deposition process.

Figure 11:
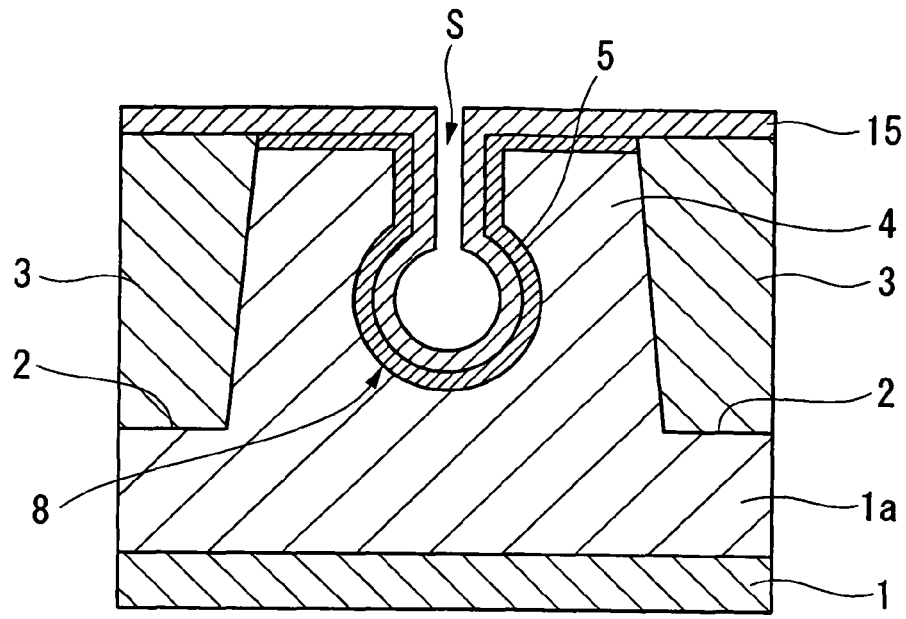
FIG. 11 is a fragmentary cross sectional elevation view illustrating a step, subsequent to the step of FIG. 10, involved in the method of forming the semiconductor device of FIGS. 1 and 2 in accordance with the first preferred embodiment of the present invention.

With reference to FIG. 11, a first conductive layer 15 is formed on the gate insulating film 5 and on the device isolation regions 3. The first conductive layer 15 extends along the gate insulating film 5. The first conductive layer 15 in combination with the gate insulating film 5 does not fill up the trench groove 8, thereby defining a hollow space S in the trench groove 8. The hollow space S extends from the opening 8c to the inside of the second groove portion 8b of the trench groove 8. The first conductive layer 15 contacts with the gate insulating film 5 in the trench groove 8, while no voids are present adjacent to the interface between the first conductive layer 15 and the gate insulating film 5. The interface between the first conductive layer 15 and the gate insulating film 5 may provide the effective channel length.

In some cases, the first conductive layer 15 may be implemented by an impurity-doped amorphous silicon film that can be formed by a chemical vapor deposition. The impurity-doped amorphous silicon film will be made into a polysilicon film by a post-heat treatment. In other cases, the first conductive layer 15 may be implemented by a polysilicon film.

Figure 12:
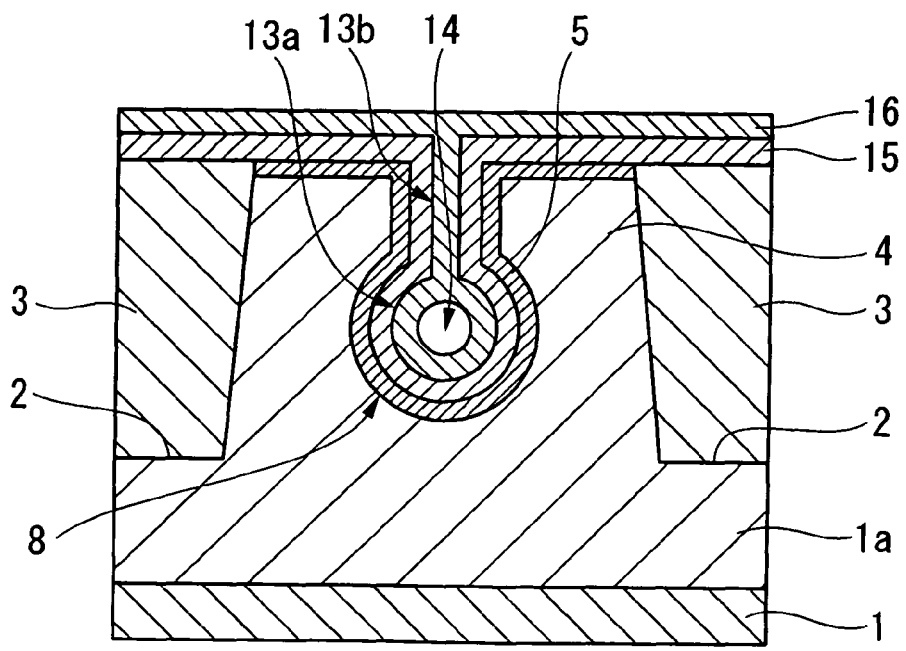
FIG. 12 is a fragmentary cross sectional elevation view illustrating a step, subsequent to the step of FIG. 11, involved in the method of forming the semiconductor device of FIGS. 1 and 2 in accordance with the first preferred embodiment of the present invention.

With reference to FIG. 12, a second conductive layer 16 is formed on the first conductive layer 15, so that the second conductive layer 16 buries the hollow space S in the trench groove 8. The second conductive layer 16 contacts with the first conductive layer 15. The second conductive layer 16 is present in and over the trench groove 8. The second conductive layer 16 has a top portion which extends over the top portion of the first conductive layer 15. The second conductive layer 16 includes first and second portions 13a and 13b. The first portion 13a is present in the second groove portion 8b. The second portion 13b is present in the first groove portion 8a. The first portion 13a may have a void 14. In other words, the first portion 13a may surround the void 14 omni-directionally. The first portion 13a separates the void 14 from the first conductive layer 15. The first conductive layer 15 in combination with the first portion 13a of the second conductive layer 16 separates the void 14 from the interface between the gate electrode 6 and the gate insulating film 5. The second portion 13b extends in a depth direction of the trench groove 8. The first portion 13a contacts with the first conductive layer 15 in the second groove portion 8b. The first portion 13a is separated from the gate insulating film 5 by the first conductive layer 15. The second portion 13b contacts with the first conductive layer 15 in the first groove portion 8a. The second portion 13b is separated from the gate insulating film 5 by the first conductive layer 15.

The first conductive layer 15 is made of the first conductive material. The second conductive layer 16 is made of the second conductive material that is thermally more stable than the first conductive material of the first conductive layer 15. Namely, the second conductive layer 16 is thermally more stable than the first conductive layer 15. Typically, the first conductive layer 15 may be made of a silicon-based material such as an impurity-doped amorphous silicon or an impurity-doped polysilicon. In this case, the second conductive layer 16 may be made of a refractory metal silicide such as tungsten silicide.

Figure 13:
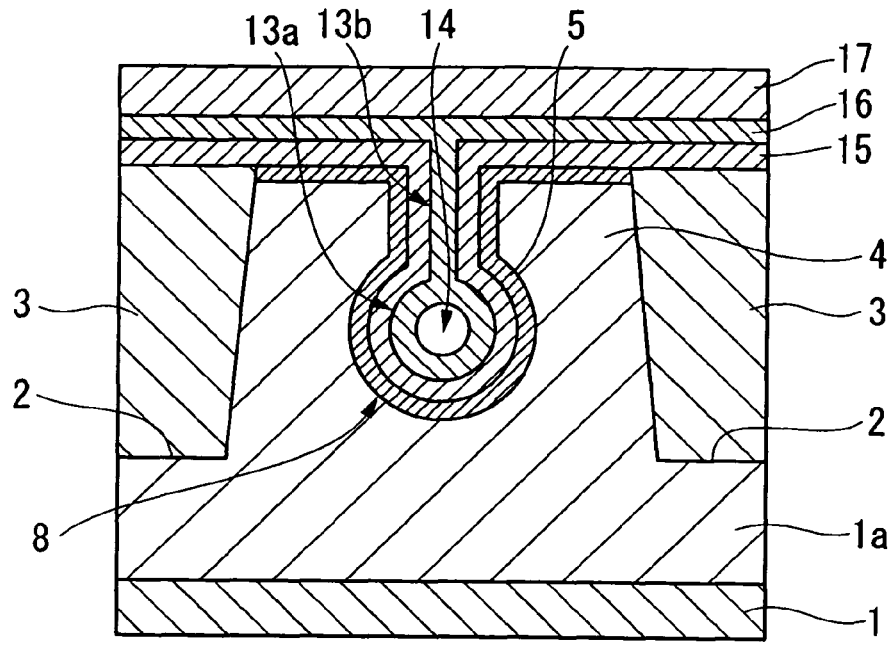
FIG. 13 is a fragmentary cross sectional elevation view illustrating a step, subsequent to the step of FIG. 12, involved in the method of forming the semiconductor device of FIGS. 1 and 2 in accordance with the first preferred embodiment of the present invention.

With reference to FIG. 13, a third conductive layer 17 is formed over the top portion of the second conductive layer 16. The third conductive layer 17 is separated from the first conductive layer 15 by the second conductive layer 16. The third conductive layer 17 may be made of a refractory metal such as tungsten. The third conductive layer 17 can be formed by a sputtering method or a chemical vapor deposition method. It is possible as a modification that a barrier layer is formed between the second and third conductive layers 16 and 17. In some cases, the barrier layer may be made of tungsten nitride.

Figure 14:
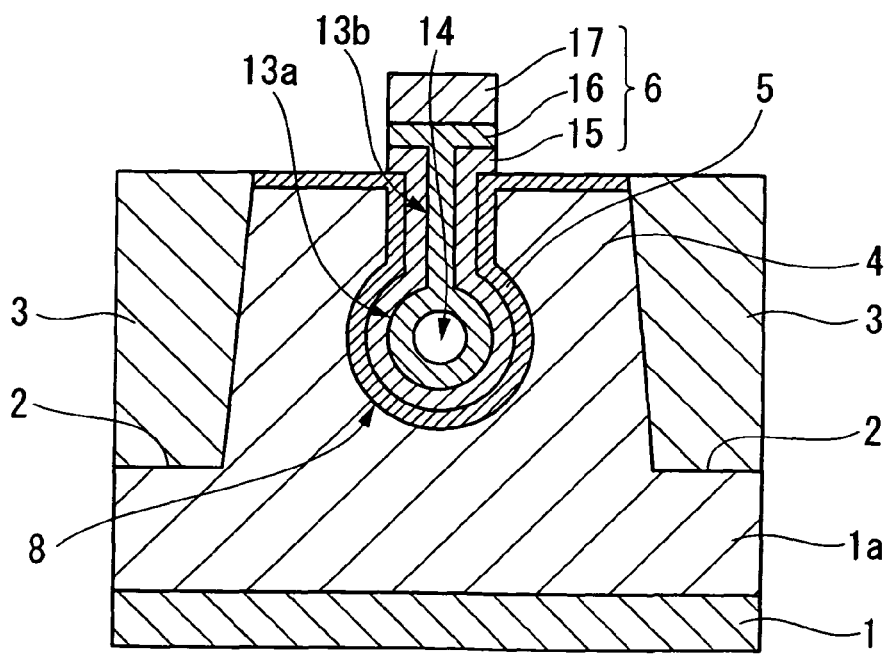
FIG. 14 is a fragmentary cross sectional elevation view illustrating a step, subsequent to the step of FIG. 13, involved in the method of forming the semiconductor device of FIGS. 1 and 2 in accordance with the first preferred embodiment of the present invention.

With reference to FIG. 14, a resist pattern is formed over the third conductive layer 17 by a lithography technique. The resist pattern is not illustrated. An anisotropic etching process is carried out using the resist pattern as a mask to selectively remove the third, second and first conductive layers, thereby forming a gate electrode 6. The resist pattern is removed. The gate electrode 6 includes the first, second, and third conductive layers 15, 16 and 17. The anisotropic etching process may be implemented by a dry etching process.

With reference again to FIG. 2, an ion-implantation process is carried out to selectively introduce an ion-impurity into the active region 4 except in the gate electrode 6 in the trench groove 8, thereby forming source and drain regions 7a and 7b in upper regions of the active region 4 of the surface layer 1a. The source and drain regions 7a and 7b are separated from each other by the trench groove 8. The trench groove 8 may be deeper than the source and drain regions 7a and 7b. The ion-impurity may be n-type impurity such as phosphorous ions, and the source and drain regions 7a and 7b may be n-type diffusion regions.

An inter-layer insulator 9 is over the gate insulating film 105 and the device isolation regions 3. Contact holes 10a and 10b are formed which penetrate the inter-layer insulator 9 and the gate insulating film 5. The contact holes 10a and 10b are positioned over the source and drain regions 7a and 7b, respectively. Contact plugs 11a and 11b are formed in the contact holes 10a and 10b, respectively, so that the contact plugs 11a and 11b are electrically connected to the source and drain regions 7a and 7b, respectively. The contact plugs 11a and 11b may be formed as follows. An impurity-doped amorphous silicon film is formed in the contact holes 10a and 10b and over the inter-layer insulator 9. The impurity-doped amorphous silicon film buries the contact holes 10a and 10b. A chemical mechanical polishing process is carried out to remove the impurity-doped amorphous silicon film over the inter-layer insulator 9, while leaving the impurity-doped amorphous silicon film in the contact holes 10a and 10b, thereby forming the contact plugs 11a and 11b in the contact holes 10a and 10b, respectively.

Contact pads 12a and 12b are formed on the contact plugs 11a and 11b, respectively. The contact pads 12a and 12b can be implemented by a stack of a tungsten silicide layer and a tungsten layer.

In any post-heat treatment, no migration or reduced migration of the second conductive material is caused in the second conductive layer 16 independent from whether any migration is caused in the first conductive layer 15. Such no migration or reduced migration may cause no move or reduced move of the void 14 in the trench groove 8 so that the void 14 is not moved to any position adjacent to the gate insulating film 5 in the second groove portion 8b. The above-described multi-layered structure of the gate electrode 6 can prevent that any void is moved to the interface between the gate electrode 6 and the gate insulating film 5. In the final product or the final process, typically no void is present on or adjacent to the interface between the gate electrode 6 and the gate insulating film 5. This causes no variation or reduced variation in performance of the semiconductor device.

Thus, the groove 8 is formed in the active region 4. The gate insulating film 5 is formed, which extends along the inside wall of the groove 8. The first conductive layer 15 as a first layer is formed which extends along the gate insulating film 5 in the groove 8. The first conductive layer 15 as the first layer is electrically conductive to perform the gate electrode 6. The second conductive layer 16 as a second layer is formed which extends along the first conductive layer 15 as the first layer in the groove. The second conductive layer 16 as the second layer is separate from the gate insulating film 5 by the first conductive layer 15 as the first layer. The second conductive layer 16 as the second layer includes the second material that is thermally more stable than the first material of the first conductive layer 15 as the first layer. The post-heat treatment is carried out so that migration or deformation of the first conductive layer 15 as the first layer is caused, while no migration or deformation of the second conductive layer 16 as the second layer is caused.

The multi-layered structure of the trench gate electrode 6 can suppress variation in performance of the semiconductor device including the trench gate transistor 51. The trench gate transistor 51 can obtain a desired threshold voltage Vth by increasing or adjusting the effective channel length under the conditions for further shrinkage of the semiconductor device.

Second Embodiment

Figure 15:
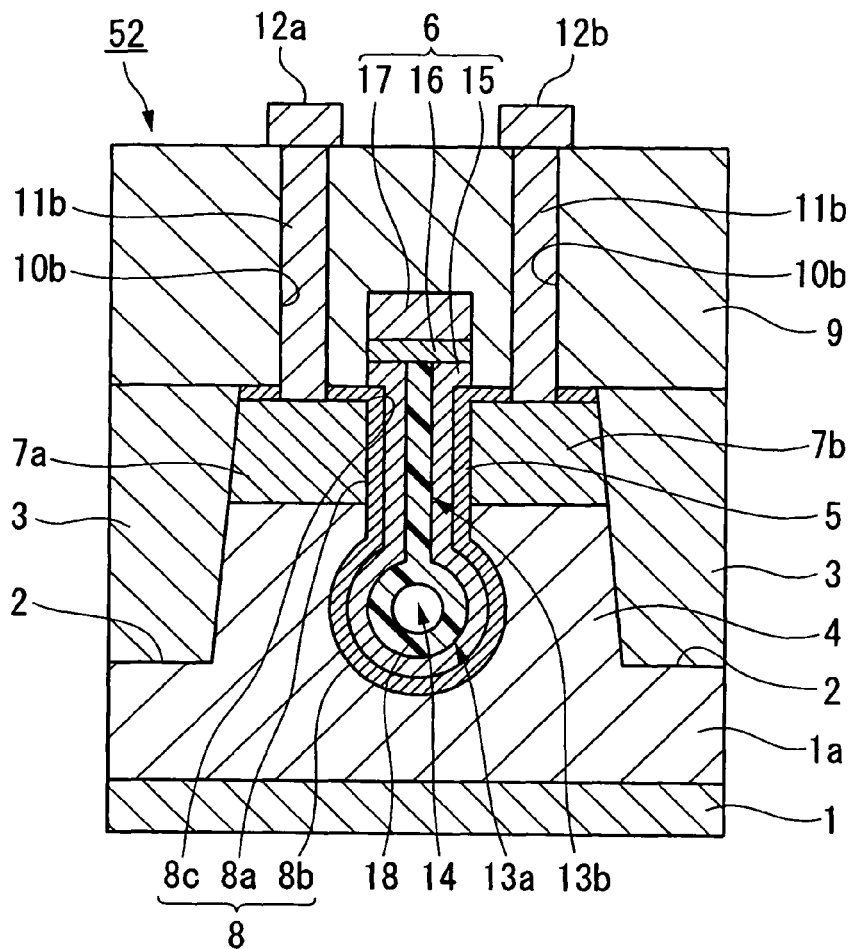
FIG. 15 is a fragmentary cross sectional elevation view illustrating a semiconductor device in accordance with a second preferred embodiment of the present invention.

A trench gate transistor 52 will be described in accordance with a second preferred embodiment of the present invention. FIG. 15 is a fragmentary cross sectional elevation view illustrating a semiconductor device in accordance with a second preferred embodiment of the present invention. The trench gate transistor 52 is identical in part to and different in part from the trench gate transistor 51 described above. Duplicate descriptions of the identical structures between the trench gate transistors 51 and 52 will be omitted. The trench gate transistor 52 is different from the trench gate transistor 51 in that a first insulating layer 18 surrounds the void 14 in the second groove portion 8b of the trench groove 8.

The trench gate transistor 52 has the trench gate structure. The trench gate structure has the gate electrode 6 that may bury the trench groove 8. The gate electrode 6 has a multi-layered structure. In some cases, the multi-layered structure of the gate electrode 6 may include at least first conductive layer 15 and a first insulating layer 18. Typically, the multi-layered structure of the gate electrode 6 may include, but is not limited to, first, second and third conductive layers 15, 16 and 17 and a first insulating layer 18.

In the trench groove, the gate insulating film 5 may extend along the inside wall of the trench groove. Typically, the first conductive layer 15 may extend along the gate insulating film 5 in the trench groove 8. Typically, the first conductive layer 15 contacts with the gate insulating film 5 in the trench groove 8, while no voids are present adjacent to the interface between the first conductive layer 15 and the gate insulating film 5. The interface between the first conductive layer 15 and the gate insulating film 5 may provide the effective channel length. Typically, the first insulating layer 18 may extend along the first conductive layer 15. Typically, the first insulating layer 18 may contact with the first conductive layer 15. In some cases, the first insulating layer 18 may be present in the trench groove 8. In some cases, the second conductive layer 16 may extend over the top portions of the first conductive layer 15 and the first insulating layer 18. In some cases, the third conductive layer 17 may be disposed over the top portion of the second conductive layer 16.

In some cases, the first insulating layer 18 may include first and second portions 13a and 13b. The first portion 13a is present in the second groove portion 8b. The second portion 13b is present in the first groove portion 8a. The first portion 13a may have a void 14. In other words, the first portion 13a may surround the void 14 omnidirectionally. The first portion 13a may separate the void 14 from the first conductive layer 15. The first conductive layer 15 in combination with the first portion 13a of the first insulating layer 18 may separate the void 14 from the interface between the gate electrode 6 and the gate insulating film 5. Typically, the second portion 13b may extend in a depth direction of the trench groove 8. The first portion 13a contacts with the first conductive layer 15 in the second groove portion 8b. The first portion 13a is separated from the gate insulating film 5 by the first conductive layer 15. The second portion 13b contacts with the first conductive layer 15 in the first groove portion 8a. The second portion 13b is separated from the gate insulating film 5 by the first conductive layer 15.

The first conductive layer 15 may be made of a first conductive material. The first insulating layer 18 may be made of a first insulating material that is thermally more stable than the first conductive material of the first conductive layer 15. Namely, the first insulating layer 18 may be thermally more stable than the first conductive layer 15. Typically, the first conductive layer 15 may be made of a silicon-based material such as an impurity-doped polysilicon. In this case, the first insulating layer 18 may be made of an insulating material such as silicon oxide or silicon nitride.

The gate electrode 18 may include, but not limited to, the first conductive layer 15 as a first layer and the first insulating layer 18 as a second layer. The first conductive layer 15 as the first layer is electrically conductive to perform as the gate electrode 6. The first insulating layer 18 as the second layer is separate from the gate insulating film 5 by the first conductive layer 15 as the first layer. The first insulating layer 18 as the second layer is different in thermal property from the first conductive layer 15 as the first layer. The first insulating layer 18 as the second layer is thermally more stable than the first conductive layer 15 as the first layer. The first conductive layer 15 as the first layer is free of any void adjacent to the gate insulating film 5.

In any post-heat treatment, no migration or reduced migration of the first insulating material is caused in the first insulating layer 18 independent from whether any migration is caused in the first conductive layer 15. Such no migration or reduced migration may cause no move or reduced move of the void 14 in the trench groove 8 so that the void 14 is not moved to any position adjacent to the gate insulating film 5 in the second groove portion 8b. The first portion 13a shows no migration or deformation in the heat treatment process, and the first portion 13a holds surrounding the void 14 omnidirectionally. The above-described multi-layered structure of the gate electrode 6 can prevent that any void is moved to the interface between the gate electrode 6 and the gate insulating film 5. In the final product or the final process, typically no void is present on or adjacent to the interface between the gate electrode 6 and the gate insulating film 5. This causes no variation or reduced variation in performance of the semiconductor device.

The multi-layered structure of the trench gate electrode 6 can suppress variation in performance of the semiconductor device including the trench gate transistor 52. The trench gate transistor 52 can obtain a desired threshold voltage Vth by increasing or adjusting the effective channel length under the conditions for further shrinkage of the semiconductor device.

A typical example of a method of forming the trench gate transistor 52 that is shown in FIG. 15 will be described with reference to FIGS. 16-20. The same processes as those described with reference to FIGS. 3-11 are carried out to obtain the same structure shown in FIG. 11.

Figure 16:
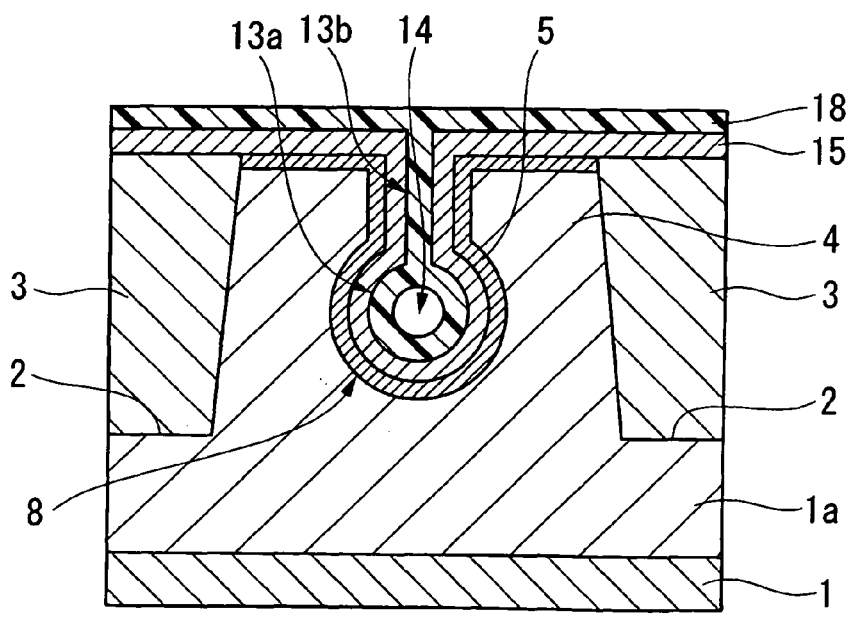
FIG. 16 is a fragmentary cross sectional elevation view illustrating a step involved in a method of forming the semiconductor device of FIG. 15 in accordance with the second preferred embodiment of the present invention.

With reference to FIG. 16, a first insulating layer 18 is formed on the first conductive layer 15, so that the first insulating layer 18 buries the hollow space S in the trench groove 8. The first insulating layer 18 contacts with the first conductive layer 15. The first insulating layer 18 is present in and over the trench groove 8. The first insulating layer 18 has a top portion which extends over the top portion of the first conductive layer 15. The first insulating layer 18 includes first and second portions 13a and 13b. The first portion 13a is present in the second groove portion 8b. The second portion 13b is present in the first groove portion 8a. The first portion 13a may have a void 14. In other words, the first portion 13a may surround the void 14 omnidirectionally. The first portion 13a separates the void 14 from the first conductive layer 15. The first conductive layer 15 in combination with the first portion 13a of the first insulating layer 18 separates the void 14 from the interface between the gate electrode 6 and the gate insulating film 5. The second portion 13b extends in a depth direction of the trench groove 8. The first portion 13a contacts with the first conductive layer 15 in the second groove portion 8b. The first portion 13a is separated from the gate insulating film 5 by the first conductive layer 15. The second portion 13b contacts with the first conductive layer 15 in the first groove portion 8a. The second portion 13b is separated from the gate insulating film 5 by the first conductive layer 15.

The first conductive layer 15 is made of the first conductive material. The first insulating layer 18 is made of the first insulating material that is thermally more stable than the first conductive material of the first conductive layer 15. Namely, the first insulating layer 18 is thermally more stable than the first conductive layer 15. Typically, the first conductive layer 15 may be made of a silicon-based material such as an impurity-doped amorphous silicon or an impurity-doped polysilicon. In this case, the first insulating layer 18 may be made of an insulating material such as silicon oxide or silicon nitride. The first insulating layer 18 can be formed by a chemical vapor deposition.

Figure 17:
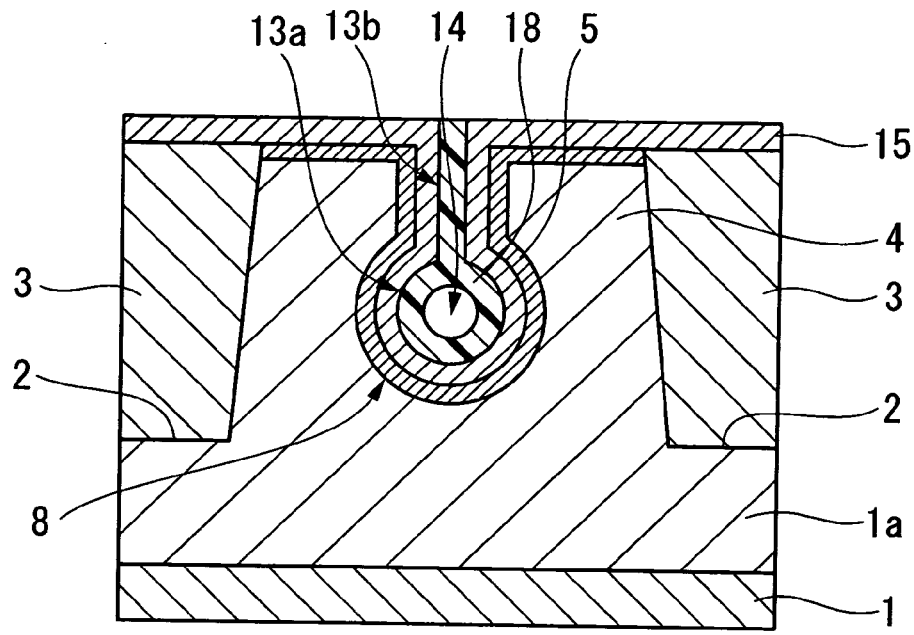
FIG. 17 is a fragmentary cross sectional elevation view illustrating a step, subsequent to the step of FIG. 16, involved in the method of forming the semiconductor device of FIG. 15 in accordance with the second preferred embodiment of the present invention.

With reference to FIG. 17, the first insulating layer 18 over the first conductive layer 15 is removed so that the first conductive layer 15 over the trench groove 8 is exposed. The removal can be implemented by etch back process using a dry etching.

Figure 18:
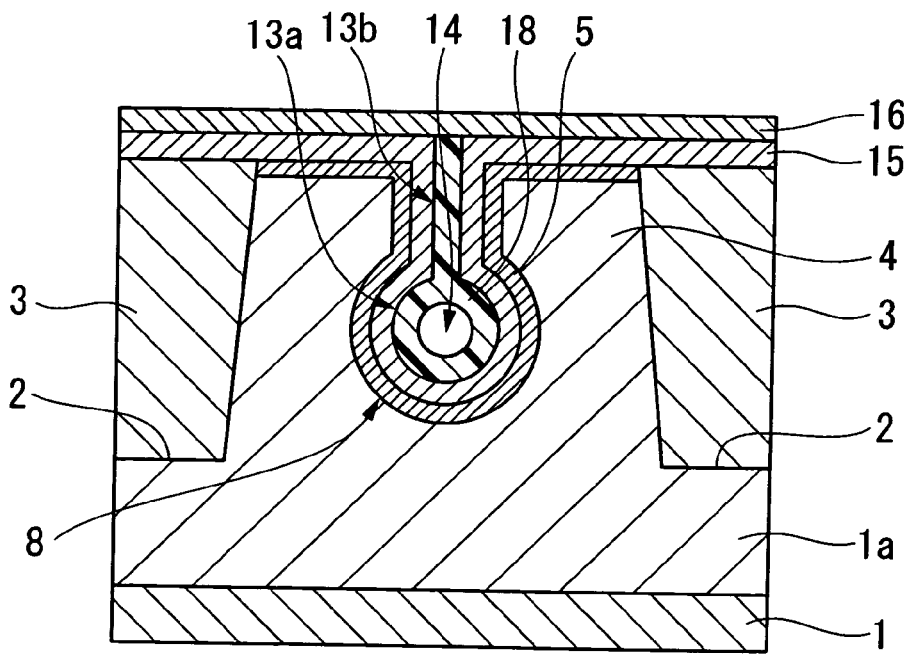
FIG. 18 is a fragmentary cross sectional elevation view illustrating a step, subsequent to the step of FIG. 17, involved in the method of forming the semiconductor device of FIG. 15 in accordance with the second preferred embodiment of the present invention.

With reference to FIG. 18, a second conductive layer 16 is formed on the top of the first insulating layer 18 and the top surface of the first conductive layer 15. The second conductive layer 16 may be made of tungsten silicide. The second conductive layer 16 can be formed by a chemical vapor deposition.

Figure 19:
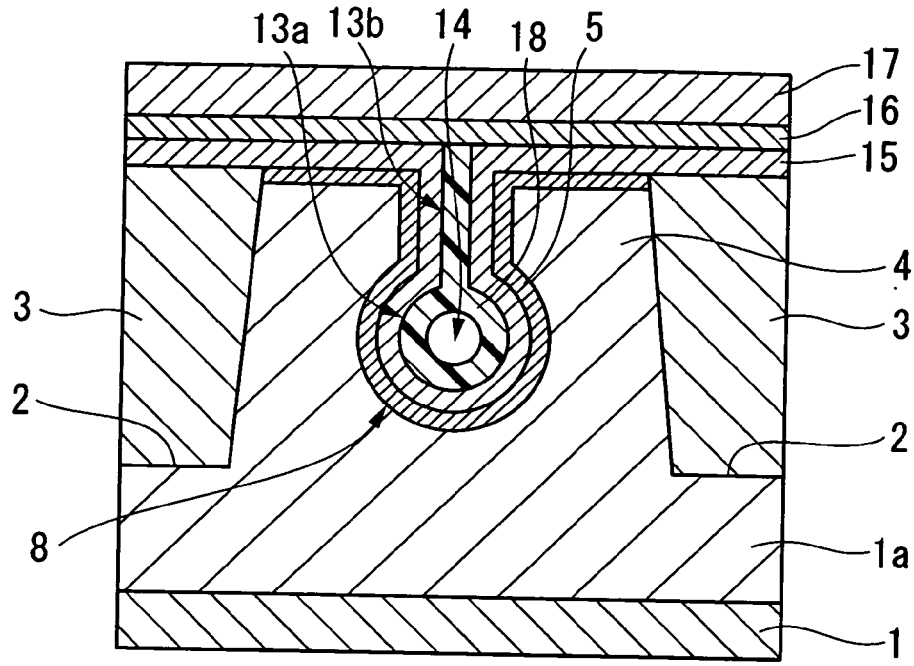
FIG. 19 is a fragmentary cross sectional elevation view illustrating a step, subsequent to the step of FIG. 18, involved in the method of forming the semiconductor device of FIG. 15 in accordance with the second preferred embodiment of the present invention.

With reference to FIG. 19, a third conductive layer 17 is formed on the second conductive layer 16. The third conductive layer 17 is separated from the first conductive layer 15 by the second conductive layer 16. The third conductive layer 17 may be made of a refractory metal such as tungsten. The third conductive layer 17 can be formed by a sputtering method or a chemical vapor deposition method. It is possible as a modification that a single layer of refractory metal silicide such as tungsten silicide can be used substituting for the stack of the second and third conductive layers 16 and 17.

Figure 20:
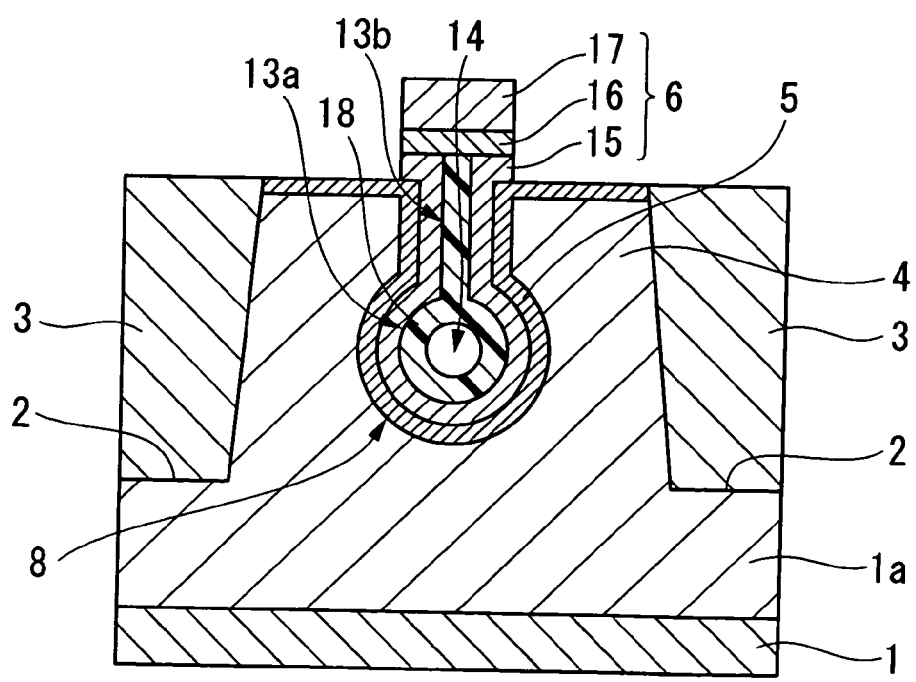
FIG. 20 is a fragmentary cross sectional elevation view illustrating a step, subsequent to the step of FIG. 19, involved in the method of forming the semiconductor device of FIG. 15 in accordance with the second preferred embodiment of the present invention.

With reference to FIG. 20, a resist pattern is formed over the third conductive layer 17 by a lithography technique. The resist pattern is not illustrated. An anisotropic etching process is carried out using the resist pattern as a mask to selectively remove the third, second and first conductive layers, thereby forming a gate electrode 6. The resist pattern is removed. The gate electrode 6 includes the first, second, and third conductive layers 15, 16 and 17 and the first insulating layer 18. The anisotropic etching process may be implemented by a dry etching process.

With reference again to FIG. 15, the same processes as those described in the first preferred embodiment are carried out in this second preferred embodiment. Duplicate descriptions will be omitted. As a result, the trench gate transistor 52 can be obtained.

In any post-heat treatment, no migration or reduced migration of the first insulating material is caused in the first insulating layer 18 independent from whether any migration is caused in the first conductive layer 15. Such no migration or reduced migration may cause no move or reduced move of the void 14 in the trench groove 8 so that the void 14 is not moved to any position adjacent to the gate insulating film 5 in the second groove portion 8b. The above-described multi-layered structure of the gate electrode 6 can prevent that any void is moved to the interface between the gate electrode 6 and the gate insulating film 5. In the final product or the final process, typically no void is present on or adjacent to the interface between the gate electrode 6 and the gate insulating film 5. This causes no variation or reduced variation in performance of the semiconductor device.

Thus, the groove 8 is formed in the active region 4. The gate insulating film 5 is formed, which extends along the inside wall of the groove 8. The first conductive layer 15 as a first layer is formed which extends along the gate insulating film 5 in the groove 8. The first conductive layer 15 as the first layer is electrically conductive to perform the gate electrode 6. The first insulating layer 18 as a second layer is formed which extends along the first conductive layer 15 as the first layer in the groove. The first insulating layer 18 as the second layer is separate from the gate insulating film 5 by the first conductive layer 15 as the first layer. The first insulating layer 18 as the second layer includes the second material that is thermally more stable than the first material of the first conductive layer 15 as the first layer. The post-heat treatment is carried out so that migration or deformation of the first conductive layer 15 as the first layer is caused, while no migration or deformation of the first insulating layer 18 as the second layer is caused.

The multi-layered structure of the trench gate electrode 6 can suppress variation in performance of the semiconductor device including the trench gate transistor 52. The trench gate transistor 52 can obtain a desired threshold voltage Vth by increasing or adjusting the effective channel length under the conditions for further shrinkage of the semiconductor device.

Third Embodiment

Figure 21:
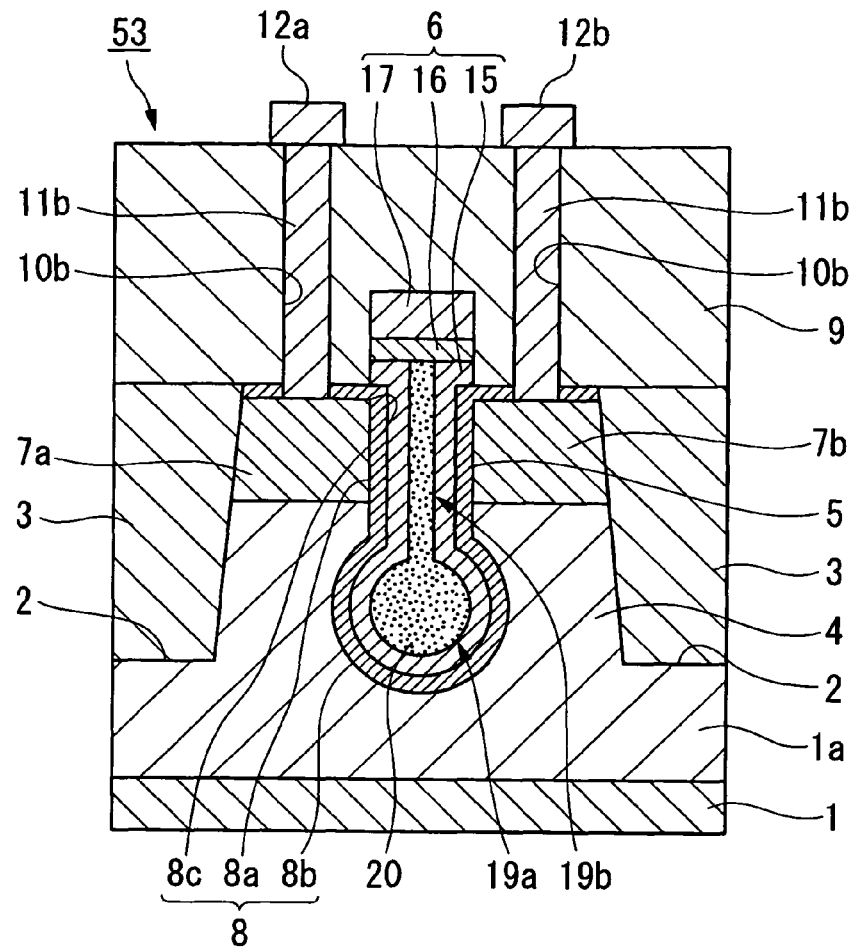
FIG. 21 is a fragmentary cross sectional elevation view illustrating a semiconductor device in accordance with a third preferred embodiment of the present invention.

A trench gate transistor 53 will be described in accordance with a third preferred embodiment of the present invention. FIG. 21 is a fragmentary cross sectional elevation view illustrating a semiconductor device in accordance with a third preferred embodiment of the present invention. The trench gate transistor 53 is identical in part to and different in part from the trench gate transistor 51 described above. Duplicate descriptions of the identical structures between the trench gate transistors 51 and 53 will be omitted. The trench gate transistor 53 is different from the trench gate transistor 51 in that a second insulating layer 20 is provided which is free of any void in the second groove portion 8b of the trench groove 8. The second insulating layer 20 may have a good gap-filling property to fill up a gap in the trench groove 8. The second insulating layer 20 may have a thermosetting property. The second insulating layer 20 may be thermoset at a lower temperature than the lowest temperature at which migration is caused in the first conductive layer 15. Typically, the second insulating layer 20 may be implemented by, but not limited to, a spin on glass (SOG) film.

The trench gate transistor 53 has the trench gate structure. The trench gate structure has the gate electrode 6 that may bury the trench groove 8. The gate electrode 6 has a multi-layered structure. In some cases, the multi-layered structure of the gate electrode 6 may include at least first conductive layer 15 and the second insulating layer 20 which is free of any void. Typically, the multi-layered structure of the gate electrode 6 may include, but is not limited to, first, second and third conductive layers 15, 16 and 17 and the second insulating layer 20 which is free of any void.

In the trench groove, the gate insulating film 5 may extend along the inside wall of the trench groove. Typically, the first conductive layer 15 may extend along the gate insulating film 5 in the trench groove 8. Typically, the first conductive layer 15 contacts with the gate insulating film 5 in the trench groove 8, while no voids are present adjacent to the interface between the first conductive layer 15 and the gate insulating film 5. The interface between the first conductive layer 15 and the gate insulating film 5 may provide the effective channel length. Typically, the second insulating layer 20 may extend along the first conductive layer 15. Typically, the second insulating layer 20 may contact with the first conductive layer 15. In some cases, the second insulating layer 20 may be present in the trench groove 8. In some cases, the second conductive layer 16 may extend over the top portions of the first conductive layer 15 and the second insulating layer 20. In some cases, the third conductive layer 17 may be disposed over the top portion of the second conductive layer 16.

In some cases, the second insulating layer 20 may include first and second portions 19a and 19b. The first portion 19a is present in the second groove portion 8b. The second portion 19b is present in the first groove portion 8a. The first portion 19a is free of any void 14. Typically, the second portion 19b may extend in a depth direction of the trench groove 8. The first portion 19a contacts with the first conductive layer 15 in the second groove portion 8b. The first portion 19a is separated from the gate insulating film 5 by the first conductive layer 15. The second portion 19b contacts with the first conductive layer 15 in the first groove portion 8a. The second portion 19b is separated from the gate insulating film 5 by the first conductive layer 15.

The second insulating layer 20 may be made of a second insulating material that has a good gap-filling property to fill up a gap or a void in the trench groove 8. The second insulating layer 20 may have a thermosetting property. A typical example of the second insulating layer 20 may include, but not limited to, a spin on glass (SOG).

The gate electrode 6 may include, but not limited to, the first conductive layer 15 as a first layer and the second insulating layer 20 as a second layer. The first conductive layer 15 as the first layer is electrically conductive to perform as the gate electrode 6. The second insulating layer 20 as the second layer is separate from the gate insulating film 5 by the first conductive layer 15 as the first layer. The second insulating layer 20 as the second layer is different in thermal property from the first conductive layer 15 as the first layer. The second insulating layer 20 as the second layer is thermoset at a lower temperature than a temperature at which migration or deformation of the first conductive layer 15 as the first layer is caused. The first conductive layer 15 as the first layer is free of any void adjacent to the gate insulating film 5.

The above-described multi-layered structure of the gate electrode 6 can prevent that any void is formed in the trench groove 8. In the final product or the final process, typically no void is present on or adjacent to the interface between the gate electrode 6 and the gate insulating film 5. This causes no variation or reduced variation in performance of the semiconductor device.

The multi-layered structure of the trench gate electrode 6 can suppress variation in performance of the semiconductor device including the trench gate transistor 53. The trench gate transistor 53 can obtain a desired threshold voltage Vth by increasing or adjusting the effective channel length under the conditions for further shrinkage of the semiconductor device.

A typical example of a method of forming the trench gate transistor 53 that is shown in FIG. 21 will be described with reference to FIGS. 22-26. The same processes as those described with reference to FIGS. 3-11 are carried out to obtain the same structure shown in FIG. 11.

Figure 22:
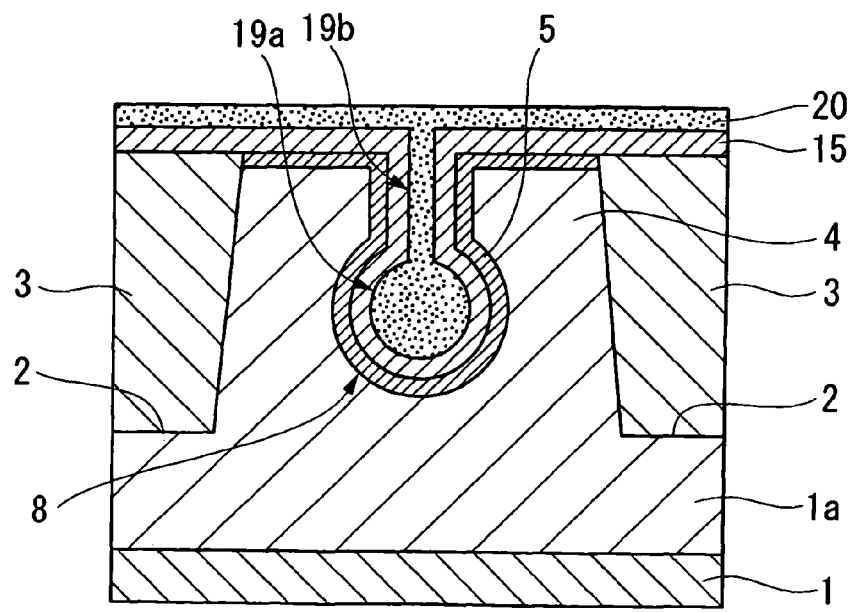
FIG. 22 is a fragmentary cross sectional elevation view illustrating a step involved in a method of forming the semiconductor device of FIG. 21 in accordance with the third preferred embodiment of the present invention.

With reference to FIG. 22, a second insulating layer 20 is formed on the first conductive layer 15, so that the second insulating layer 20 fills up the hollow space S in the trench groove 8 and no void is formed in the trench groove 8. The second insulating layer 20 contacts with the first conductive layer 15. The second insulating layer 20 is present in and over the trench groove 8. The second insulating layer 20 has a top portion which extends over the top portion of the first conductive layer 15. The second insulating layer 20 includes first and second portions 19a and 19b. The first portion 19a is present in the second groove portion 8b. The second portion 19b is present in the first groove portion 8a. The first portion 19a is free of any void. The second portion 19b extends in a depth direction of the trench groove 8. The first portion 19a contacts with the first conductive layer 15 in the second groove portion 8b. The first portion 19a is separated from the gate insulating film 5 by the first conductive layer 15. The second portion 19b contacts with the first conductive layer 15 in the first groove portion 8a. The second portion 19b is separated from the gate insulating film 5 by the first conductive layer 15.

The second insulating layer 20 is made of a second insulating material that has a good gap-filling property to fill up a gap or a void in the trench groove 8. The second insulating layer 20 has a thermosetting property. The second insulating layer 20 may be thermoset at a lower temperature than the lowest temperature at which migration is caused in the first conductive layer 15. The second insulating layer 20 may be made of, but not limited to, a spin on glass (SOG). In this case, the second insulating layer 20 can be formed by the coating method. A heat treatment is carried out at about 300° C. to thermoset the second insulating layer 20, while no migration is caused in the first conductive layer 15, thereby forming no void in the gate electrode 6. The temperature of 300° C. is below the lowest temperature at which a migration is caused in the first conductive layer 15. The second insulating layer 20 can prevent that any void is formed in the process for forming the second insulating layer 20 and also in the process for thermosetting the second insulating layer 20.

Figure 23:
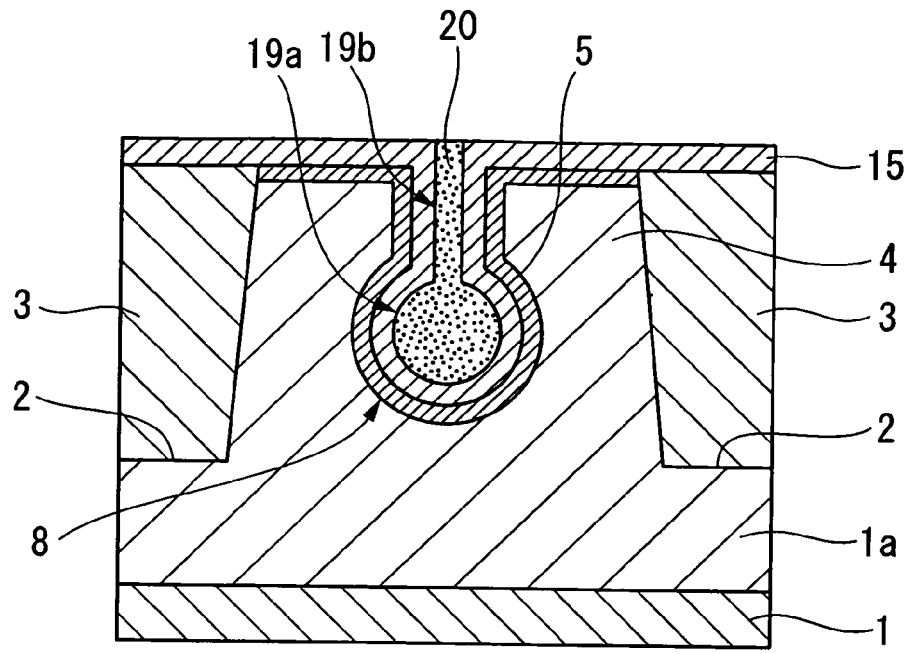
FIG. 23 is a fragmentary cross sectional elevation view illustrating a step, subsequent to the step of FIG. 22, involved in the method of forming the semiconductor device of FIG. 21 in accordance with the third preferred embodiment of the present invention.

With reference to FIG. 23, the second insulating layer 20 over the first conductive layer 15 is removed so that the first conductive layer 15 over the trench groove 8 is exposed. The removal can be implemented by etch back process using a dry etching.

Figure 24:
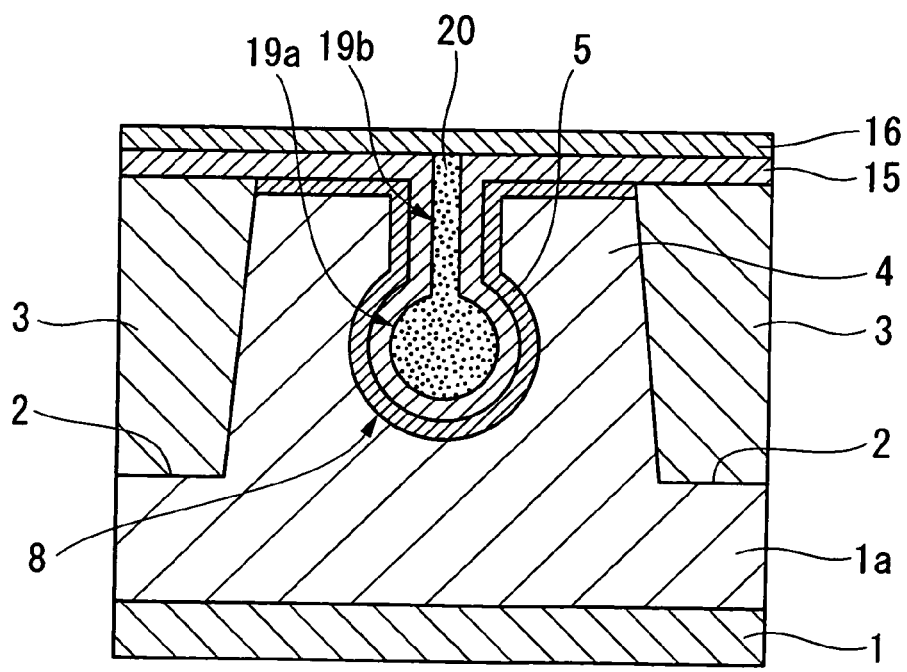
FIG. 24 is a fragmentary cross sectional elevation view illustrating a step, subsequent to the step of FIG. 23, involved in the method of forming the semiconductor device of FIG. 21 in accordance with the third preferred embodiment of the present invention.

With reference to FIG. 24, a second conductive layer 16 is formed on the top of the second insulating layer 20 and the top surface of the first conductive layer 15. The second conductive layer 16 may be made of tungsten silicide. The second conductive layer 16 can be formed by a chemical vapor deposition.

Figure 25:
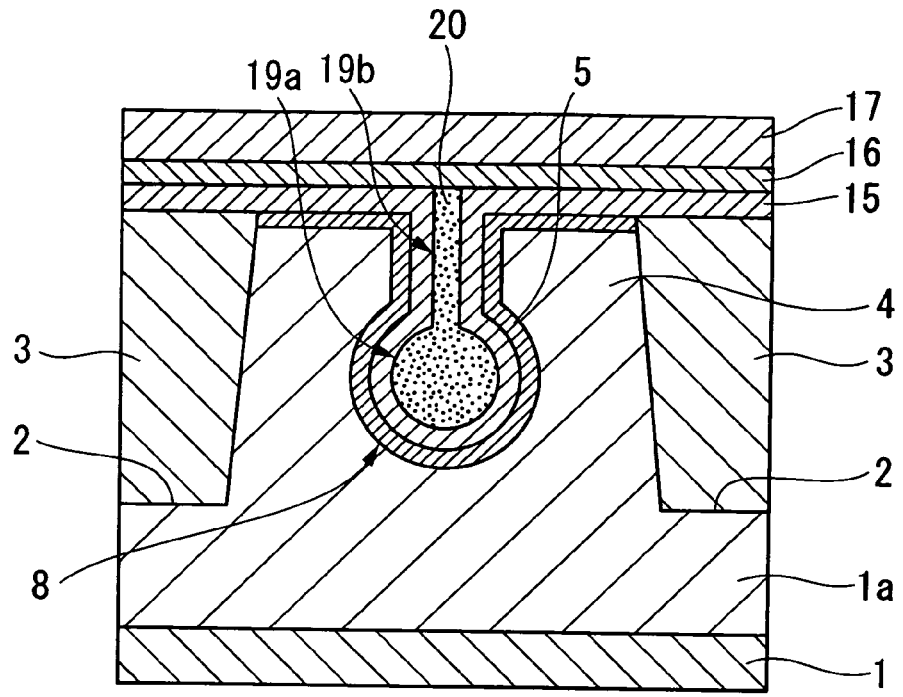
FIG. 25 is a fragmentary cross sectional elevation view illustrating a step, subsequent to the step of FIG. 24, involved in the method of forming the semiconductor device of FIG. 21 in accordance with the third preferred embodiment of the present invention.

With reference to FIG. 25, a third conductive layer 17 is formed on the second conductive layer 16. The third conductive layer 17 is separated from the first conductive layer 15 by the second conductive layer 16. The third conductive layer 17 may be made of a refractory metal such as tungsten. The third conductive layer 17 can be formed by a sputtering method or a chemical vapor deposition method. It is possible as a modification that a single layer of refractory metal silicide such as tungsten silicide can be used substituting for the stack of the second and third conductive layers 16 and 17.

Figure 26:
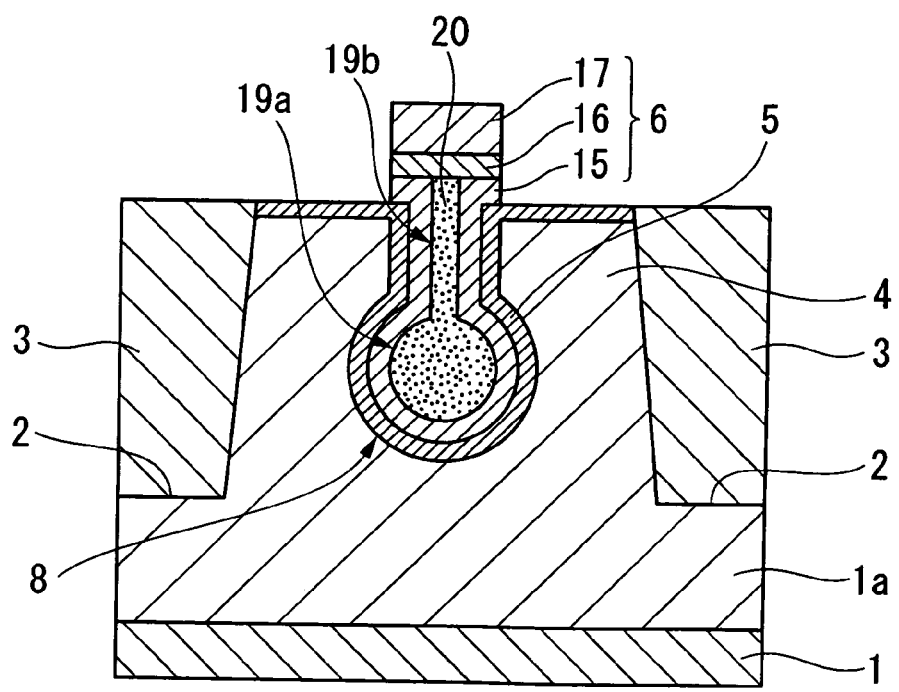
FIG. 26 is a fragmentary cross sectional elevation view illustrating a step, subsequent to the step of FIG. 25, involved in the method of forming the semiconductor device of FIG. 21 in accordance with the third preferred embodiment of the present invention.

With reference to FIG. 26, a resist pattern is formed over the third conductive layer 17 by a lithography technique. The resist pattern is not illustrated. An anisotropic etching process is carried out using the resist pattern as a mask to selectively remove the third, second and first conductive layers, thereby forming a gate electrode 6. The resist pattern is removed. The gate electrode 6 includes the first, second, and third conductive layers 15, 16 and 17 and the second insulating layer 20. The anisotropic etching process may be implemented by a dry etching process.

With reference again to FIG. 21, the same processes as those described in the first preferred embodiment are carried out in this second preferred embodiment. Duplicate descriptions will be omitted. As a result, the trench gate transistor 53 can be obtained.

The second insulating layer 20 is made of a second insulating material that has a good gap-filling property to fill up a gap or a void in the trench groove 8. The second insulating layer 20 has a thermosetting property. The second insulating layer 20 may be thermoset at a lower temperature than the lowest temperature at which migration is caused in the first conductive layer 15. The second insulating layer 20 may be thermoset, while no migration is caused in the first conductive layer 15, thereby forming no void adjacent to the interface between the gate electrode 6 and the gate insulating film 5. This causes no variation or reduced variation in performance of the semiconductor device.

Thus, the groove 8 is formed in the active region 4. The gate insulating film 5 is formed, which extends along the inside wall of the groove 8. The first conductive layer 15 as a first layer is formed which extends along the gate insulating film 5 in the groove 8. The first conductive layer 15 as the first layer is electrically conductive to perform the gate electrode 6. The second insulating layer 20 as a second layer is formed which extends along the first conductive layer 15 as the first layer in the groove. The second insulating layer 20 as the second layer is separate from the gate insulating film 5 by the first conductive layer 15 as the first layer. The post-heat treatment is carried out so that no migration or deformation of the first conductive layer 15 as the first layer is caused, while the second insulating layer 20 as the second layer is thermoset.

The multi-layered structure of the trench gate electrode 6 can suppress variation in performance of the semiconductor device including the trench gate transistor 53. The trench gate transistor 53 can obtain a desired threshold voltage Vth by increasing or adjusting the effective channel length under the conditions for further shrinkage of the semiconductor device.

Modifications:

In the first embodiment, the trench gate transistor 51 includes the second conductive layer 16 including the first portion 13a which surrounds the void 14 omnidirectionally. The first portion 13a shows no migration or deformation in the heat treatment process, and the first portion 13a holds surrounding the void 14 omnidirectionally. The second conductive layer 16 may be made of any conductive material allowing that the first portion 13a shows no migration or deformation in the heat treatment process, and the first portion 13a holds surrounding the void 14 omnidirectionally.

In the second embodiment, the trench gate transistor 52 includes the first insulating layer 18 including the first portion 13a which surrounds the void 14 omnidirectionally. The first portion 13a shows no migration or deformation in the heat treatment process, and the first portion 13a holds surrounding the void 14 omnidirectionally. The first insulating layer 18 may be made of any insulating material allowing that the first portion 13a shows no migration or deformation in the heat treatment process, and the first portion 13a holds surrounding the void 14 omnidirectionally.

In the trench gate transistor 51 of the first preferred embodiment, the second conductive layer 16 including the first portion 13a may be made of other refractory metal silicide than the above-described material of tungsten silicide. Other example of the material for the second conductive layer 16 may include, but is not limited to, titanium silicide. The third conductive layer 17 may be made of other refractory metals than the above-described metal of tungsten. Other example of the material for the third conductive layer 17 may include, but is not limited to, titanium.

Any barrier layer can be inserted into between the refractory metal silicide layer and the refractory metal layer. An additional layer such as a silicon nitride film can be formed on the refractory metal layer.

In each of the trench gate transistors 52 of the second and third preferred embodiments, the stack of the second conductive layer 16 and the third conductive layer 17 can be modified. The second and third conductive layers 16 and 17 may be made of other refractory metal silicide such as titanium silicide and other refractory metal such as titanium, respectively. The stack of the second conductive layer 16 and the third conductive layer 17 can be modified into a single layer of a refractory metal silicide.

In each of the trench gate transistors 51, 52 and 53 in the first, second, and third embodiments, the trench gate 8 has the first groove portion 8a and the second groove portion 8b which is positioned directly under the first groove portion 8a. The second groove portion 8b is wider than the first groove portion 8a. In some cases, the second groove portion 8b can be formed by a heat treatment such as a hydrogen anneal at about 850° C. In other cases, the second groove 27 can be formed by selectively exposing the bottom of the first groove 23 to an isotropic etching, so that the second groove 27 is wider than the first groove 23. The second groove 27 that is wider than the first groove 23 might be likely to form a void in the wider and lower groove portion.

In each of the trench gate transistors 51, 52 and 53 in the first, second and third embodiments, interconnections may be connected directly to the contact plugs 11a and 11b without using the contact pads 12 and 12b.

In each of the trench gate transistors 51, 52 and 53 in the first, second and third embodiments, the source and drain regions 7a and 7b may be either n-doped diffusion layers or p-doped diffusion layers. Phosphorous ions may be introduced into the active region to form n-doped source and drain regions 7a and 7b. Boron ions may be introduced into the active region to form p-doped source and drain regions 7a and 7b.

In each of the trench gate transistors 51, 52 and 53 in the first, second and third embodiments, the contact plugs 11a and 11b may be formed by burying a refractory metal such as tungsten into the contact holes 10a and 10b.

Fourth Embodiment

Figure 27:
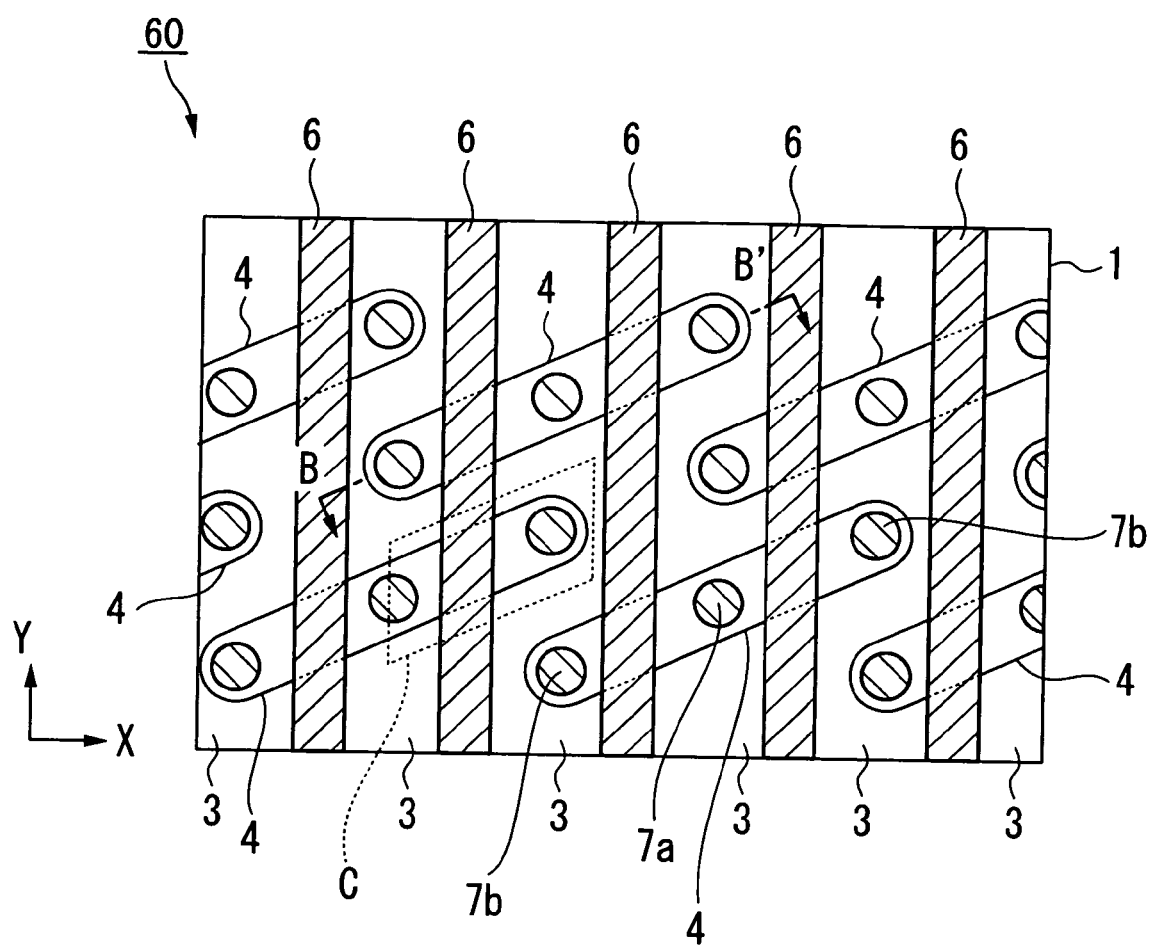
FIG. 27 is a fragmentary plan view illustrating a semiconductor device in accordance with a fourth preferred embodiment of the present invention.
Figure 28:
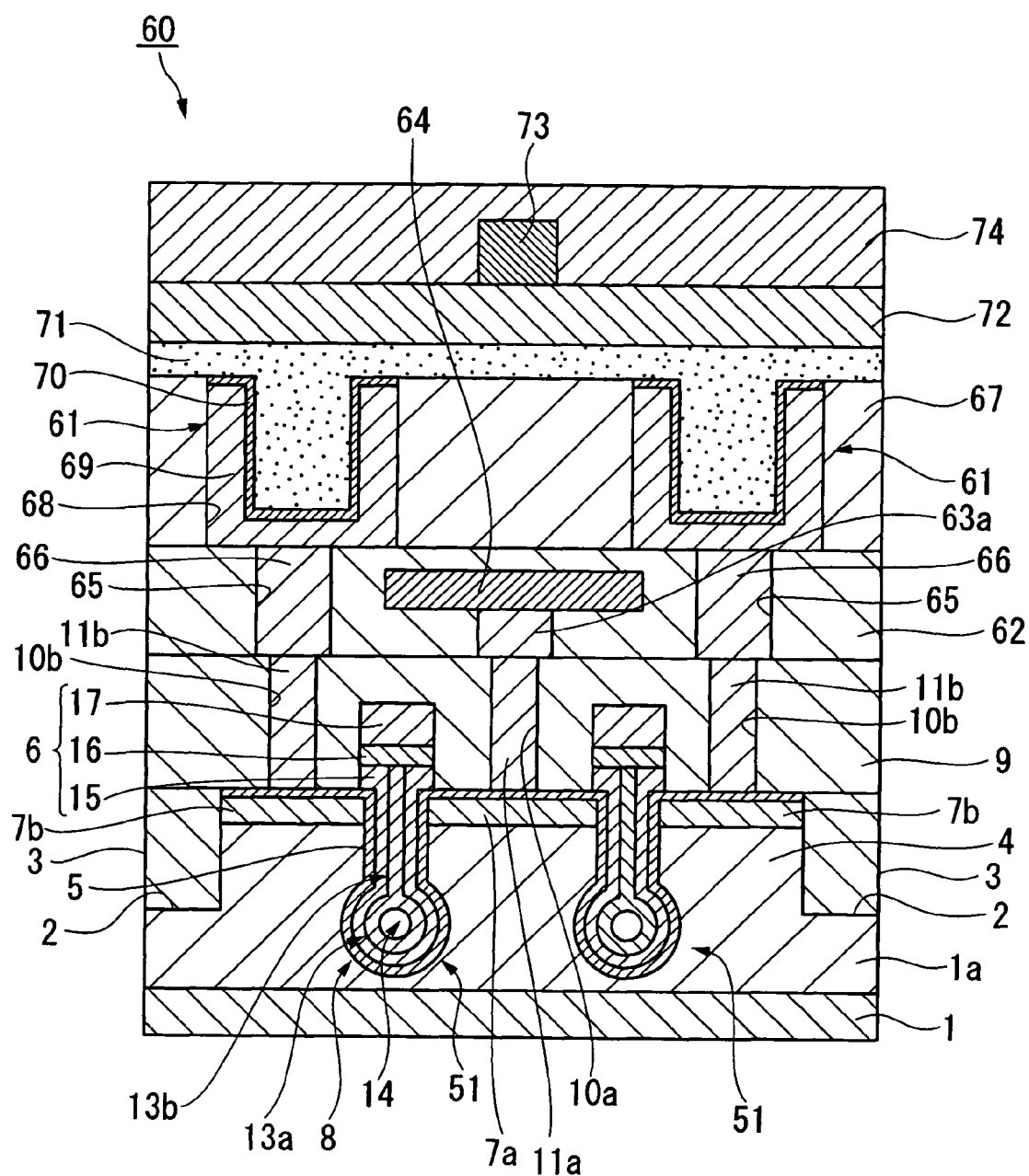
FIG. 28 is a fragmentary cross sectional elevation view illustrating the semiconductor device, taken along a B-B line of FIG. 27.

A semiconductor device 60 including a trench gate transistor 51 will be described in accordance with a fourth preferred embodiment of the present invention. FIG. 27 is a fragmentary plan view illustrating a semiconductor device in accordance with a fourth preferred embodiment of the present invention. FIG. 28 is a fragmentary cross sectional elevation view illustrating the semiconductor device, taken along a B-B line of FIG. 27. A semiconductor device 60 including an array of memory cells each having a trench gate transistor 51 is will be described. Duplicate descriptions of the identical structures with the trench gate transistor 51 will be omitted. In FIG. 27, a broken line C shows each trench gate transistor 51.

A semiconductor device 60 performs as a memory cell in DRAM, wherein the memory cells each includes a pair of the trench gate transistors 51 and a capacitor 61. The capacitor 61 is electrically connected to one of the source and drain regions 7a and 7b.

The semiconductor substrate 1 has isolation grooves 2 which are buried with the device isolation regions 3. The semiconductor substrate 1 also has a two-dimensional array of active regions 4 which are each defined by the device isolation regions 3. The active regions 4 are aligned in X-direction and Y-direction. Each active region 4 has a slender shape which has a longitudinal direction that is oblique to the X-direction and Y-direction.

In each active region 4, two trench gate transistors 51 are aligned. Each trench gate transistor 51 is as described above. Each trench gate transistor 51 has the trench groove 8 and the gate electrode 6 in the trench groove 8. The gate electrode 6 has the multi-layered structure of the first, second and third conductive layers 15, 16 and 17. The second conductive layer 16 is separated from the gate insulating film 5 by the first conductive layer 15. The trench groove 8 has the first and second groove portions 8a and 8b. The second conductive layer 16 has the first and second portions 13a. The first portion 13a is present in the second groove portion 8b. The second portion 13b is present in the first groove portion 8a. The first portion 13a surrounds the void 14. The first conductive layer 15 can be implemented by, but not limited to, the impurity-doped polysilicon film 15. The second conductive layer 16 can be implemented by, but not limited to, the tungsten silicide film. The third conductive layer 17 can be implemented by, but not limited to, the tungsten film. The gate electrodes 6 are aligned at a constant pitch in the X-direction, and each gate electrode 6 extends across the active regions 4 and in the Y-direction. Each gate electrode 6 performs as a word line of the DRAM.

In accordance with this semiconductor device 60, the source and drain regions 7b and 7a are provided, which are separated by the trench grooves 8. The source and drain regions 7b and 7a can be implemented by, but not limited to, n-diffusion layers. The n-diffusion layers can be formed by carrying out an ion-implantation of phosphorus ions. The drain region 7a is positioned at the center of the active region 4. The source regions 7b are positioned at the both sides of the drain region 7a. The inter-layer insulator 9 extends over the gate insulating film 5 and the device isolation regions 3. The contact holes 10a and 10b penetrate the inter-layer insulator 9 and the gate insulating film 5. The contact holes 10a and 10b are positioned directly over the drain and source regions 7a and 7b, respectively. The contact holes 10a and 10b reach the drain and source regions 7a and 7b, respectively. The contact plugs 11a and 11b in the contact holes 10a and 10b contact with the drain and source regions 7a and 7b, respectively. Namely, the contact plugs 11a and 11b in the contact holes 10a and 10b are electrically connected to the drain and source regions 7a and 7b, respectively. Two adjacent trench gate transistors 51 commonly use the contact plug 11a.

An inter-layer insulator 62 is provided over the inter-layer insulator 9 and the contact plugs 11a and 11b. A contact plug 63a is provided in the inter-layer insulator 62. The contact plug 63a contacts with the contact plug 11a. An interconnection layer 64 is also provided in the inter-layer insulator 62. The interconnection layer 64 contacts with the contact plug 63a. The interconnection layer 64 is electrically connected through the contact plugs 63a and 11a to the drain region 7a. The interconnection layer 64 performs as a bit line in the DRAM. In the DRAM, plural interconnection layers 64 are aligned at a constant pitch in the Y-direction. Each interconnection layer 64 extends in the X-direction. The interconnection layer 64 is not illustrated in FIG. 27. Contact holes 65 are provided in the inter-layer insulator 62. The contact holes 65 are positioned directly over the contact plugs 11b. The contact holes 65 reach the contact plugs 11b. Contact plugs 66 are provided in the contact holes 65. The contact plugs 66 contact with the contact plugs 11b.

An inter-layer insulator 67 is provided over the inter-layer insulator 62 and the contact plugs 66. Capacitor holes 68 are formed in the inter-layer insulator 67. The capacitor holes 68 are positioned directly over the contact plugs 66. Bottom electrodes 69 are formed in the capacitor holes 68. Capacitive insulating films 70 are formed on the bottom electrodes 69 in the capacitor holes 68. A top electrode 71 is provided on the capacitive insulating films 70 and over the inter-layer insulator 67. The top electrode 71 fills up the capacitor holes 68. Capacitors 61 are provided in the capacitor holes 68. Each capacitor 61 includes the bottom electrode 69, the capacitive insulating film 70 and the top electrode 71. The bottom electrodes 69 contact with the contact plugs 66. The bottom electrodes 69 are electrically connected to the source regions 7b through the contact plugs 66 and 11b.

An inter-layer insulator 72 is formed over the top electrode 71 of the capacitors 61. An interconnection layer 72 extends over the inter-layer insulator 72. A passivation film 74 is provided over the inter-layer insulator 72 and the interconnection layer 72.

The semiconductor device 60 performs as the DRAM. The trench gate transistor 51 turns ON to decide whether the capacitor 61 is charged or not.

The trench gate transistors 51 in the semiconductor device 60 suppress variations in performance thereof. The trench gate transistor 51 has sufficient effective channel length to have a desired threshold voltage Vth, while shrinkage of the semiconductor device 60 is made. The trench gate transistors 51 allow that the DRAM has desired performance under the conditions for dense array of memory cells which include the trench gate transistors 51.

The memory cells of the semiconductor device 60 may each include the trench gate transistor 52 or 53 instead of the trench gate transistor 51.

Even in the fourth embodiment the trench gate transistor 51, 52 or 53 is applied to the memory cells of the DRAM, it is possible to apply the trench gate transistor 51, 52 or 53 to any other semiconductor devices that may include the trench gate transistors. For example, the trench gate transistor 51, 52 or 53 may be applied to, but not limited to, logic devices free of nay memory cells.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   an active region having a groove comprising an expanded portion having a width which is greater than a width of an opening of the groove;
   a gate insulating film extending along the inside wall of the groove; and
   a gate electrode in the groove, the gate electrode comprising:
      a first layer extending along the gate insulating film, the first layer being electrically conductive; and
      a second layer extending along the first layer, the second layer being separate from the gate insulating film by the first layer, the second layer being different in thermal property from the first layer, and the second layer comprising an innermost layer of the gate electrode in the expanded portion and including a material comprising one of glass, silicon nitride and refractory metal silicide,
   wherein the first layer comprises a first material, and the material of the second layer comprises one of a second material that is thermally more stable than the first material, and a third material that is thermoset at a lower temperature than a temperature at which migration or deformation of the first layer is caused, and
   wherein the first material is silicon and the second material is silicon nitride.

2. The semiconductor device according to claim 1, wherein the groove includes a portion connecting the expanded portion and the opening of the groove.

3. A semiconductor device comprising:
   an active region having a groove;
   a gate insulating film extending along the inside wall of the groove; and a gate electrode in the groove, the gate electrode comprising:
- a first layer extending along the gate insulating film, the first layer being electrically conductive, the first layer being free of any void adjacent to the gate insulating film; and
- a second layer extending along the first layer, the second layer being separate from the gate insulating film by the first layer, wherein the first layer comprises silicon and the second layer comprises a glass.

4. The semiconductor device according to claim 2, wherein the second layer is free of a void.

5. The semiconductor device according to claim 3, wherein the groove has an expanded portion that is wider than the opening of the groove.

6. A semiconductor device comprising:
- an active region having a groove, the groove having an expanded portion that is wider than the opening of the groove;
- a gate insulating film extending along the inside wall of the groove; and
- a gate electrode in the groove, the gate electrode having a multi-layered structure in at least the expanded portion of the groove, the multi-layered structure comprising:
  - a first layer extending along the gate insulating film, the first layer being electrically conductive; and
  - a second layer extending along the first layer, the second layer being separate from the gate insulating film by the first layer, and the second layer comprising an innermost layer of the gate electrode in the expanded portion and including a material comprising one of glass, silicon nitride and refractory metal silicide, wherein the second layer is free of a void.

7. The semiconductor device according to claim 6, wherein the first layer comprises a first material, and the material of the second layer is thermoset at a lower temperature than a temperature at which migration or deformation of the first layer is caused.

* * * * *